US009183944B2

(12) United States Patent
Kim et al.

(10) Patent No.: US 9,183,944 B2
(45) Date of Patent: Nov. 10, 2015

(54) METHOD OF WRITING DATA IN NON-VOLATILE MEMORY DEVICE

(71) Applicant: Samsung Electronics Co., Ltd., Suwon-Si, Gyeonggi-Do (KR)

(72) Inventors: Si-Hwan Kim, Seongnam-si (KR); Sang-Yong Yoon, Seoul (KR); Kyung-Ryun Kim, Daejeon (KR)

(73) Assignee: SAMSUNG ELECTRONICS CO., LTD, Gyeonggi-Do (KR)

( * ) Notice: Subject to any disclaimer, the term of this patent is extended or adjusted under 35 U.S.C. 154(b) by 0 days.

(21) Appl. No.: 14/272,906

(22) Filed: May 8, 2014

(65) Prior Publication Data

US 2014/0376310 A1 Dec. 25, 2014

(30) Foreign Application Priority Data

Jun. 25, 2013 (KR) .................. 10-2013-0072775

(51) Int. Cl.
*G11C 16/04* (2006.01)
*G11C 16/34* (2006.01)
*G11C 11/56* (2006.01)

(52) U.S. Cl.
CPC ........ *G11C 16/3427* (2013.01); *G11C 11/5628* (2013.01); *G11C 16/3459* (2013.01); *G11C 16/0483* (2013.01)

(58) Field of Classification Search
CPC . G11C 16/3418; G11C 16/0483; G11C 16/10
USPC ............................ 365/185.02, 185.17, 185.18
See application file for complete search history.

(56) References Cited

U.S. PATENT DOCUMENTS

| 8,411,501 | B2 | 4/2013 | Park et al. | |
|---|---|---|---|---|
| 8,570,801 | B2 | 10/2013 | Lim et al. | |
| 2008/0084747 | A1* | 4/2008 | Hemink et al. | 365/185.18 |
| 2008/0159002 | A1* | 7/2008 | Dong et al. | 365/185.25 |
| 2009/0003084 | A1* | 1/2009 | Kim et al. | 365/185.29 |
| 2009/0231916 | A1* | 9/2009 | Kim et al. | 365/185.05 |
| 2010/0074017 | A1 | 3/2010 | Lim | |
| 2011/0205817 | A1 | 8/2011 | Yoon et al. | |
| 2012/0069667 | A1 | 3/2012 | Shirakawa | |
| 2013/0010549 | A1* | 1/2013 | Aritome | 365/189.011 |

FOREIGN PATENT DOCUMENTS

| KR | 20090092099 A | 8/2009 |
|---|---|---|
| KR | 1139107 | 12/2011 |

* cited by examiner

*Primary Examiner* — Connie Yoha
(74) *Attorney, Agent, or Firm* — Harness, Dickey & Pierce, PLC

(57) ABSTRACT

A method of writing data in a non-volatile memory device includes receiving a program command and a first row address corresponding to a first word line; performing a first partial programming operation with respect to first memory cells coupled to the first word line; performing a second partial programming operation with respect to second memory cells coupled to a second word line adjacent to the first word line; performing a first verification operation by verifying the first partial programming operation; and selectively performing a first additional programming operation with respect to the first memory cells depending on a result of the first verification operation.

20 Claims, 21 Drawing Sheets

METHOD OF WRITING DATA IN NON-VOLATILE MEMORY DEVICE

CROSS-REFERENCE TO RELATED APPLICATION

This U.S. Non-provisional application claims priority under 35 USC §119 to Korean Patent Application No. 10-2013-0072775, filed on Jun. 25, 2013, in the Korean Intellectual Property Office (KIPO), the disclosure of which is incorporated by reference in its entirety herein.

BACKGROUND

1. Technical Field

At least some example embodiments of the inventive concepts relate generally to semiconductor memory devices, and more particularly to a non-volatile memory device, a memory system including a non-volatile memory device and a method of writing data in a non-volatile memory device.

2. Discussion of the Related Art

Semiconductor memory devices may be divided into volatile memory devices and non-volatile memory devices according to whether the stored data are maintained when power is off. The non-volatile memory device may include an electrically erasable and programmable ROM (EEPROM).

The operation modes of the EEPROM may include a program mode to write data in memory cells, a read mode to read out the data stored in the memory cells and an erase mode to initialize the memory cells by deleting the stored data. In incremental step pulse programming (ISPP), verification and reprogramming after the verification may be repeated until the verification is successful.

A multi-level cell (MLC) may store at least two data bits. When the N bits are stored in each MLC, the distribution of the threshold voltages of the MLCs may be divided into $2^N$ states and each state may represent a corresponding value of the N-bit data. For example, when two bits are stored in each MLC, the distribution of the threshold voltages may be divided into four states. When the bit value '0' of the write data indicates 'program permission' and the bit value '1' indicates 'program prohibition', the four states may be represented as '11', '10', '01' and '00' in an order of the increasing threshold voltages. In this case, '11' corresponds to an erase state having the lowest threshold voltage distribution of the memory cells that are not programmed.

The distribution distortion may be caused through the program operation due to floating gate coupling between the memory cells coupled to the adjacent word lines. If the distribution distortion is serious, the data may not be written in the memory cells exactly and errors may occur in the reading the stored data.

SUMMARY

At least one example embodiment of the inventive concepts provides a non-volatile memory device and a method of writing data in a non-volatile memory device, capable of reducing word line coupling effect using a partial program to decrease a maximum change of the threshold voltage before and after program. The various embodiments of the partial program are provided to be selected considering the number of data latches and data loading time.

According to at least one example embodiment, a method of writing data in a non-volatile memory device, includes receiving a program command and a first row address corresponding to a first word line; performing a first partial programming operation with respect to first memory cells coupled to the first word line; performing a second partial programming operation with respect to second memory cells coupled to a second word line adjacent to the first word line; performing a first verification operation by verifying the first partial programming operation; and selectively performing a first additional programming operation with respect to the first memory cells depending on a result of the first verification operation.

The first partial programming operation may be performed by applying a first program voltage to the first word line, the second partial programming operation may be performed by applying a second program voltage to the second word line, and the first additional programming operation may be performed by applying pulse voltages to the first word line, the pulse voltages increasing sequentially from a third program voltage greater than the first program voltage.

The method may further include performing a first additional programming verification operation by verifying the first additional programming operation, wherein the first additional programming operation is performed by alternatively applying a verification voltage and each of the pulse voltages to the first word line based on results of the first additional programming verification operation.

The method may further include receiving the program command and a second row address corresponding to a second word line after the first additional programming operation is completed; performing a third partial programming operation with respect to third memory cells coupled to a third word line adjacent to the second word line; performing a second verification operation by verifying the second partial programming operation; and performing a second additional programming operation with respect to the second memory cells based on a result of the second verification operation.

First program data may be received and stored in a data latch of the non-volatile memory device, and the first partial programming operation may be performed based on the first program data in the data latch, and after the first partial programming operation is completed, second program data may be received and stored in the data latch, and the second partial programming operation is performed based on the second program data in the data latch.

After the second partial programming operation is completed, the first program data may be received and stored again in the data latch, and the first additional programming operation may be performed based on the first program data in the data latch.

The method may further include performing a first additional programming verification operation by verifying the first additional programming operation, wherein the first additional programming operation is performed by applying the pulse voltages to the first word line based on the first program data in the data latch without receiving additional data for the first additional programming operation, and the pulse voltages are applied sequentially to the first word line until results of the first additional programming verification operation indicate that the first additional programming operation is completed.

First program data may be received and stored in a first data latch, second program data is received and stored in a second latch, the first partial programming operation may be performed based on the stored first program data, the second partial programming operation may be performed based on the stored second program data, and the first additional programming operation may be performed based on the stored first program data.

The stored first program data may be used to perform both of the first partial programming operation and the first additional programming operation, and the stored second program data may be used to perform only the second partial programming operation.

The method may further include receiving the program command and a second row address corresponding to a second word line after the first additional programming operation is completed; performing a third partial programming operation with respect to third memory cells coupled to a third word line adjacent to the second word line; performing a second verification operation by verifying the second partial programming operation; and performing a second additional programming operation with respect to the second memory cells depending on a result of the second verification operation.

The first and second memory cells may be included in a plurality of memory cells of the non-volatile memory device, the plurality of memory cells may be multi-level cells, each multi-level cell of the plurality of memory cells may store at least two data bits, and the first additional programming operation may include programming data having at least two data bits into the first memory cells.

Each of the plurality of memory cells may stores N data bits, each of the plurality of memory cells may be programmed to have one of $2^N$ data states, the first and second partial programming operations may be performed by applying a first program voltage pulse set of $2^N-1$ pulse voltages to the first word line and the second word line, respectively, and the first additional programming operation may be performed by applying a second program voltage pulse set of $2^N-1$ pulse voltages to the first word line, the $2^N-1$ pulse voltages of the second program voltage pulse set increasing sequentially from voltage levels greater than the $2^N-1$ pulse voltages of the first program voltage pulse set.

The first additional programming may be verified by applying a set of verification voltage pulses to the first word line, the set of verification voltage pulses may include $2^N-1$ verification voltages respectively corresponding to the $2^N$ data states.

The method may further include performing a first additional programming verification operation by verifying the first additional programming operation, wherein the first additional programming operation is performed by alternatively applying the second program voltage pulse set and the set of verification voltage pulses to the first word line based on results of the first additional programming verification operation.

The first verification operation may be performed using a plurality of sense amplifiers included in the non-volatile memory device, each of the plurality of sense amplifiers being coupled to a bit line of the non-volatile memory device.

The first memory cells are implemented as a first vertical string of cells, the second memory cells are implemented as a second vertical string of cells, the first partial programming operation is performed on the first vertical string of cells, and the second partial programming operation is performed on the second vertical string of cells, the first and second vertical strings being formed in a vertical direction to a semiconductor substrate.

According to at least one example embodiment, a method of writing data in a non-volatile memory device includes receiving a program command indicating first data to be programmed into first memory cells of a first word line; and programming the first data into the first memory cells by, determining whether threshold voltages of the first memory cells correspond to the first data after performing a first partial programming operation on the first memory cells and performing a second partial programming operation on second memory cells coupled to a second word line adjacent to the first word line, selectively performing an additional programming operation on the first memory cells depending on a result of the determining.

The method may further include performing the first partial programming operation; and performing the second partial programming operation, wherein the first partial programming operation is performed before the second partial programming operation, and selectively performing the additional programming operation includes programming the first data into the first memory cells if the determining indicates that threshold voltages of the first memory cells do not correspond to the first data indicated in the received program command.

The programming the first data may include performing an incremental step pulse programming (ISPP) operation on the first memory cells, and the first partial programming operation may include applying a first one of a plurality of program pulses of the ISPP operation to the first memory cells, respective voltages of the plurality of program pulses increasing incrementally from the first one of the plurality of program pulses to a last one of the plurality of program pulses.

The additional programming operation may include applying, to the first memory cells, one or more of the plurality of program pulses other than the first program pulse until the first data is programmed into the first memory cells.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
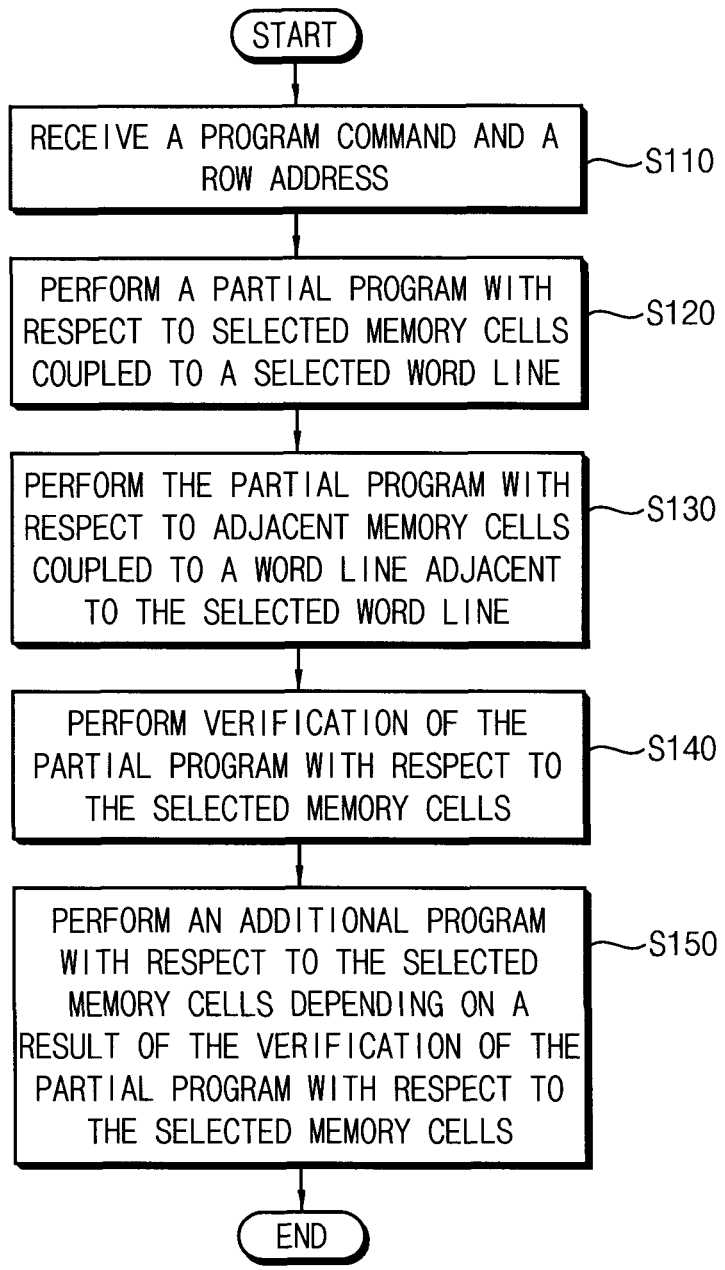
FIG. 1 is a flowchart illustrating a method of writing data in a non-volatile memory device according to at least some example embodiments of the inventive concepts.

Detailed example embodiments of the inventive concepts are disclosed herein. However, specific structural and functional details disclosed herein are merely representative for purposes of describing example embodiments. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The non-volatile memory device according to at least some example embodiments of the inventive concepts may include NAND flash memory, vertical NAND flash memory, NOR flash memory, resistive random access memory (RRAM), phase-change random access memory (PRAM), magneto-resistive random access memory (MRAM), ferroelectric random access memory (FRAM), spin transfer torque random access memory (STT-RAM), etc. In at least some example embodiments of the inventive concepts, the non-volatile memory device may have a three-dimensional array structure. At least some example embodiments of the inventive concepts of the inventive concepts may be applied to charge trap flash (CTF) memory in which the charge storage is implemented with a dielectric film, in addition to typical flash memory in which the charge storage is implemented with a conductive floating gate. In this disclosure, the data writing method according to at least some example embodiments of the inventive concepts are described based on the NAND flash memory for convenience of description.

FIG. 1 is a flowchart illustrating a method of writing data in a non-volatile memory device according to at least some example embodiments of the inventive concepts.

Referring to FIG. 1, a program command and a first row address with respect to a first word line are received (S110) by the non-volatile memory device from an external device such as a memory controller. The address received with the command may include a column address for selecting a bit line and a row address for selecting a word line. A partial program is performed with respect to first memory cells coupled to the first word line, that is, the selected word line (S120). For example, the flash memory device may receive the program command and the address from the external controller. The flash memory device may select a word line to be programmed based on the received row address. The data writing operation may be performed by applying predetermined voltages to the selected word line and the respective bit lines so that the electrons may be trapped in the floating gate of the flash memory cell. The program voltage may be applied to the selected word line and the program pass voltage may be applied to the unselected word lines.

The target memory cells may be determined by selectively applying the program permission voltage or the program prohibition voltage to the respective bit lines depending on the write data. The partial program may be performed such that one program pulse is applied to the selected word line. When the partial program is performed, the threshold voltages of the selected memory cells may be lower than the target threshold voltage corresponding to the program-completed state.

After the partial program with respect to the first memory cells, the partial program is performed with respect to second memory cells coupled to a second word line adjacent to the first word line (S130). The adjacent word line or the second word line may be one of the two word lines disposed both sides of the selected word line or the first word line. When the selected memory cells coupled to the first word line are programmed and the threshold voltages of the selected memory cells are changed, the adjacent memory cells or the second memory cells coupled to the second word line may be influenced by the coupling effect and the threshold voltages of the adjacent word line may be broadened. The partial program with respect to the adjacent memory cells, which are influenced by the partial program with respect to the selected memory cells, may reduce the coupling effect.

After the partial program with respect to the second memory cells, a verification of the partial program with respect to the first memory cells is performed (S140). The program verification is determining whether the program is successfully completed by measuring the threshold voltages of the programmed memory cells. The predetermined verification voltage is applied to the selected word line to determine whether each programmed memory cell is an on-cell or an off-cell. The programmed memory cell being determined to be the on-cell as the result of the program verification indicates verification fail, that the threshold voltage of the programmed memory cell is lower than the verification voltage, and further programming is required. The programmed memory cell being determined to be the off-cell as the result of the program verification it indicates verification success and that further programming is not required.

An additional program is performed with respect to the first memory cells depending on a result of the verification of the partial program with respect to the first memory cells (S150). If the result indicates verification fail, the additional program is performed with respect to the selected memory cells, that is, the first memory cells. The additional program may be performed by applying pulse voltages to the first word line, where the pulse voltages are higher than the program voltage of the partial program. In the additional program, a verification voltage and each of the pulse voltages are applied alternatively to the first word line based on the verification results of the additional program. If the result indicates verification fail, the pulse voltage is increased and then the program and the verification are repeated. As such the pulse voltages are increased sequentially from a program voltage greater than the program voltage of the partial program. If the result indicates verification success, the additional program is completed.

Figure 2A:
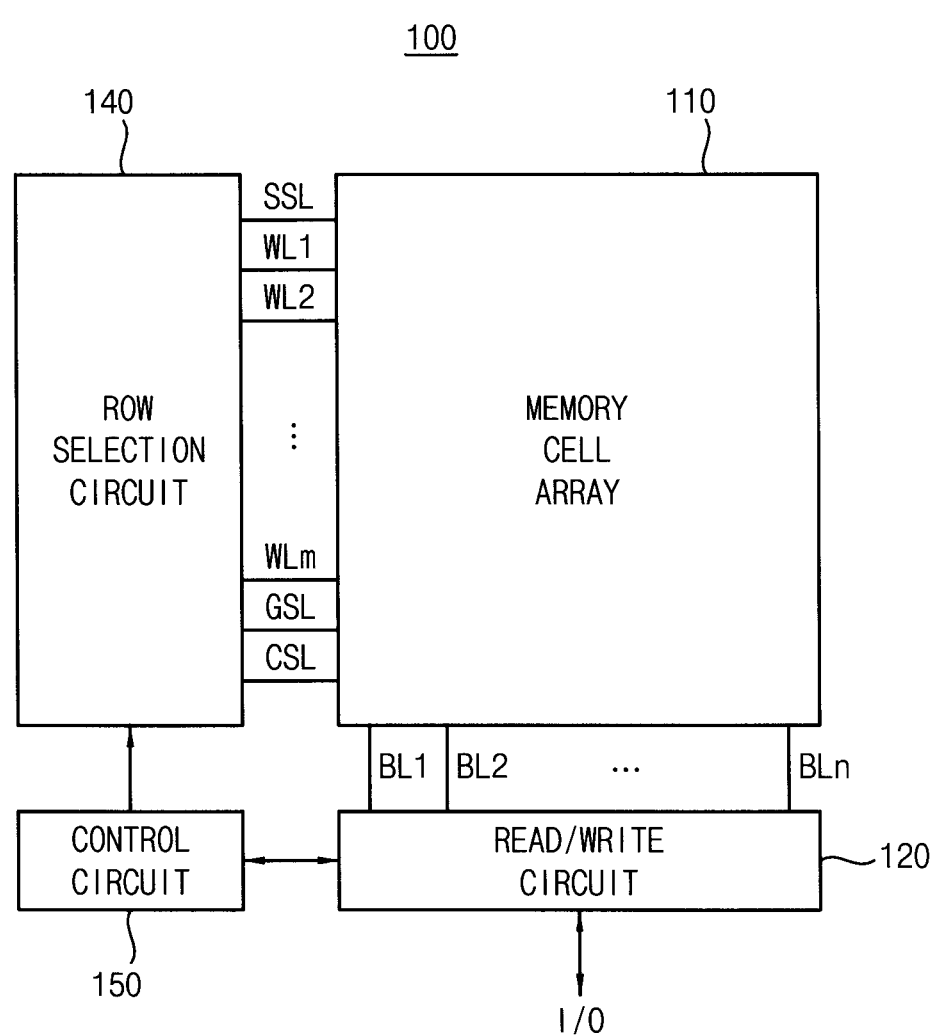
FIG. 2A is a block diagram illustrating a non-volatile memory device according to at least some example embodiments of the inventive concepts.
Figure 2B:
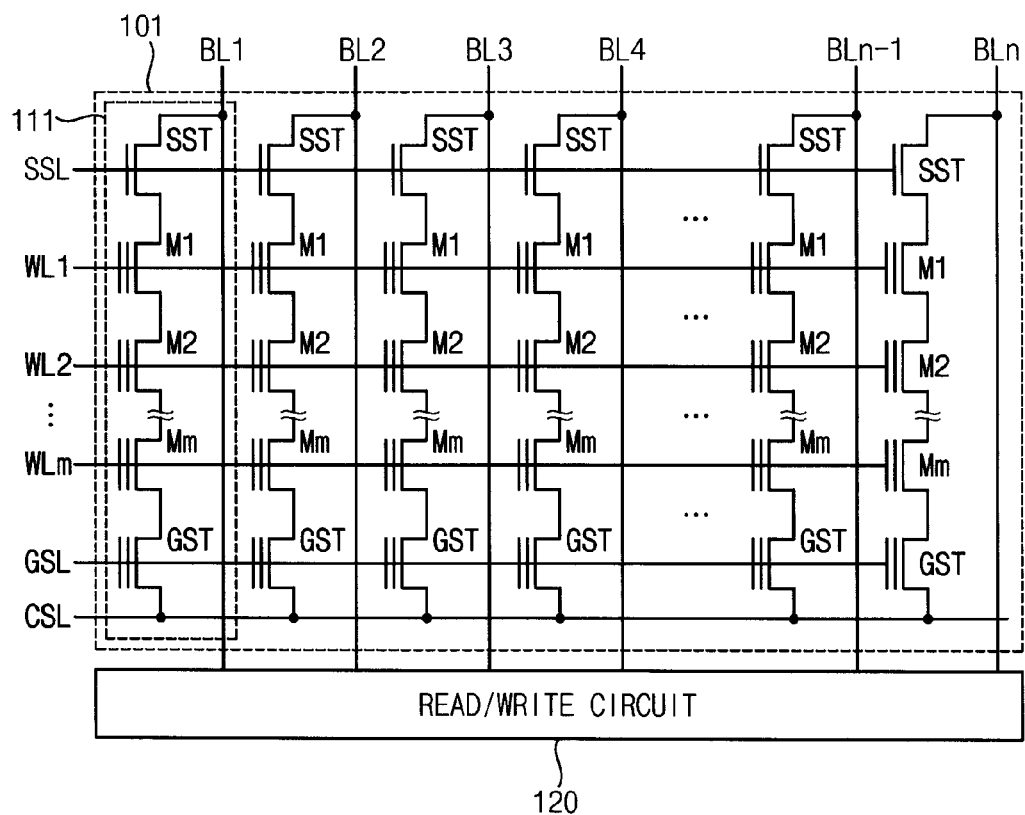
FIG. 2B is a diagram illustrating a memory cell array in the non-volatile memory device of FIG. 2A.

FIG. 2A is a block diagram illustrating a non-volatile memory device according to at least some example embodiments of the inventive concepts, and FIG. 2B is a diagram illustrating a portion of memory cell array and a read/write circuiting the non-volatile memory device of FIG. 2A. For convenience of description, a NAND flash memory device is illustrated in FIGS. 2A and 2B as an example of the non-volatile memory device.

Referring to FIGS. 2A and 2B, a flash memory device 100 may include a memory cell array 110, a read/write circuit 120, a row selection circuit 140 and a control circuit 150. The memory cell array 110 may include a plurality of memory cells. Each memory cell may store one-bit data or multi-bit data.

The memory cell storing one bit may be referred to as a single-level cell (SLC) and the memory cell storing multiple bits may be referred to as a multi-level cell (MLC). The memory cell array 110 may include a main region for storing general data and a spare region for storing additional information including, for example, flag information, error correction code, device code, maker code, page information etc. In some embodiments, the main region may include the MLCs and the spare region may include SLCs or MLCs.

The memory cell array 110 may include a plurality of memory cells that are disposed at cross points of a plurality of rows or word line and a plurality of columns or bit lines. The memory cells in the memory cell array 110 may form a plurality of memory blocks. As illustrated in FIG. 2B, the memory cells in each memory block 101 of the memory cell array 110 may have the NAND string structure. Even though the method of writing data according to at least some example embodiments of the inventive concepts of the inventive concepts are described referring the NAND flash memory device, but the method is not limited thereto. The method of writing data according to at least some example embodiments of the inventive concepts of the inventive concepts may be applied to various types of the flash memory device and further to other kinds of the non-volatile memory device.

Referring to FIG. 2B, one memory block 101 may include a plurality of NAND strings corresponding to a plurality of columns or bit lines BL1~BLn. Each string 111 may include a string selection transistor SST, a plurality of memory cells M1~Mm and a ground selection transistor GST. In each string 111, the drain of the string selection transistor SST is coupled to the corresponding one of the bit lines BL1~BLn and the source of the ground selection transistor GST is coupled to the common source line CSL. The memory cells M1~Mm are coupled serially between the source of the string selection transistor SST and the drain of the ground selection transistor GST.

The control gates of the memory cells in the same row may be commonly coupled to the corresponding one of the word lines WL1~WLm. The string selection transistor SST is controlled by the voltage on the string selection line SSL, and the ground selection transistor GST is controlled by the voltage on the ground selection line GSL. The memory cells M1~Mm are controlled by the voltages on the word lines WL1~WLm. The memory cells coupled to each word line may store data of one page. In other embodiments, the memory cells coupled to each word line may store data of multi-pages or a sub-page smaller than one page.

The unit for program may be determined variously. For example, the write operation and the read operation of the NAND flash memory device may be performed by unit of page and the erase operation may be performed by unit of memory block of multi-pages. In case of MLC, the program operation may be performed independently for the respective bits.

Referring again to FIG. 2A, the control circuit 150 may control the overall operations associated with the write, read and erase operations of the flash memory device 100. The data to be programmed may be loaded to the read/write circuit 120 under control of the control circuit 150. During the program operation, the control circuit 150 may control the row selection circuit 140 and the read/write circuit 120 so that the program voltage Vpgm is applied to the selected word line, the program pass voltage Vpass is applied to the unselected word lines, and the bulk bias voltage (e.g., 0V) is applied to the bulk of the memory cells.

The program voltage Vpgm may be generated according to incremental step pulse programming (ISPP). The level of the program voltage Vpgm may be increased or decreased sequentially by a voltage interval ΔV as the program loops are repeated. The number of the program pulses, the voltage levels of the program pulses, the duration time of each program pulse, etc. may be determined variously by the control circuit 150 or an external memory controller.

The control circuit 150 may generate the bulk voltage or the word line voltages such as the program voltage Vpgm, the pass voltage Vpass, the verification voltage Vvfy, the read voltage Vread, etc. The row selection circuit 140 may select one memory block in the memory cell array 110 and one word line in the selected memory block, in response the row address and the control signals from the control circuit 150. The row selection circuit 140 may provide the corresponding word line voltages to the selected word line and the unselected word lines in response to the control signals from the control circuit 150.

The read/write circuit 120 is controlled by the control circuit 150 to operate as a sense amplifier or a write driver depending on the operation modes. For example, the read/write circuit 120 may operate as the sense amplifier for reading out the data from the memory cell array 110 during the verification read operation or the normal read operation. The read data during the normal read operation may be provided to an external device such as a memory controller or a host device while the read data during the verification read operation may be provided to a pass/fail verification circuit (not shown).

In case of the write operation, the read/write circuit 120 may operate as the write driver for driving the bit lines based on the data to be written in the memory cell array 110. The read/write circuit 120 may receive the data from the external device and drive the bit lines based on the received data. The read/write circuit 120 may include a plurality of page buffers corresponding to a plurality of rows of bit lines.

In programming the memory cells coupled to the selected word line, the program voltage Vpgm and the verification voltage Vvfy may be applied alternatively to the selected word line. For the verification operation, the bit lines coupled to the selected memory cells may be precharged. The voltage change of the precharged bit line may be detected by the corresponding page buffer. The detected data during the verification read operation may be provided to the pass/fail verification circuit to determine whether the corresponding memory cell is programmed successfully. As described below, the flash memory device may perform the program verification operation selectively by the control of the control circuit 150.

Figure 3A:
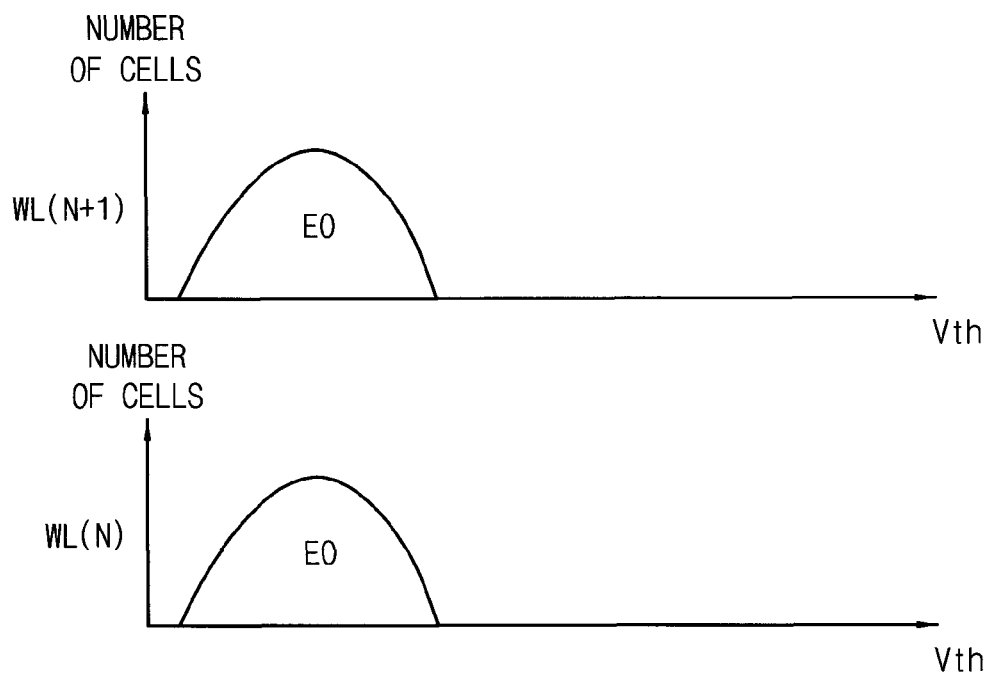
FIGS. 3A, 3B and 3C are diagrams illustrating example threshold voltage distributions by a program operation in a flash memory.
Figure 3B:
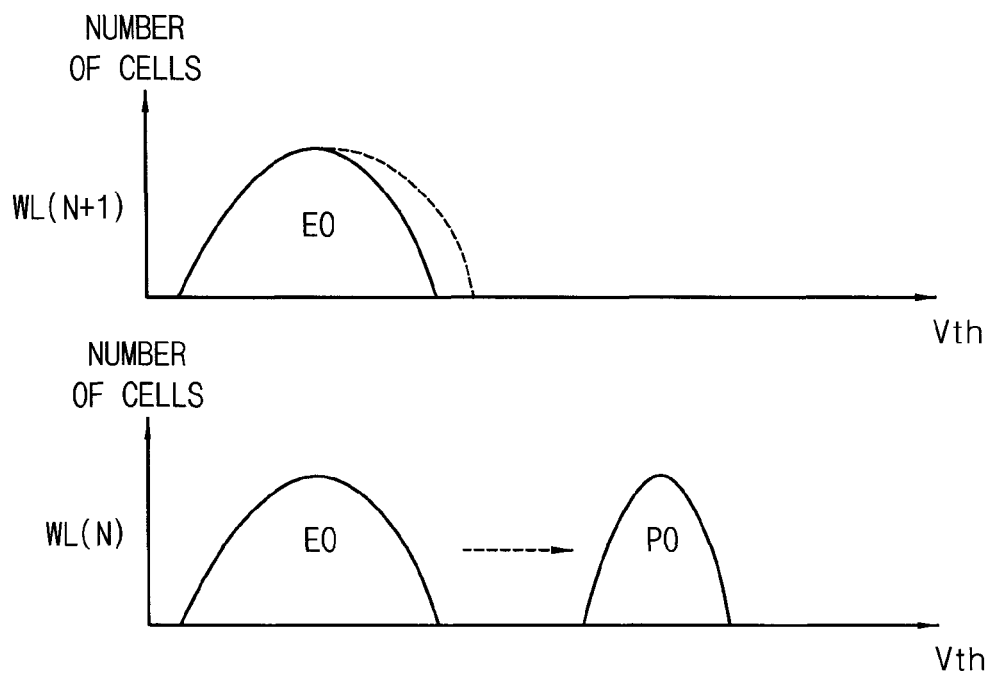
Figure 3C:
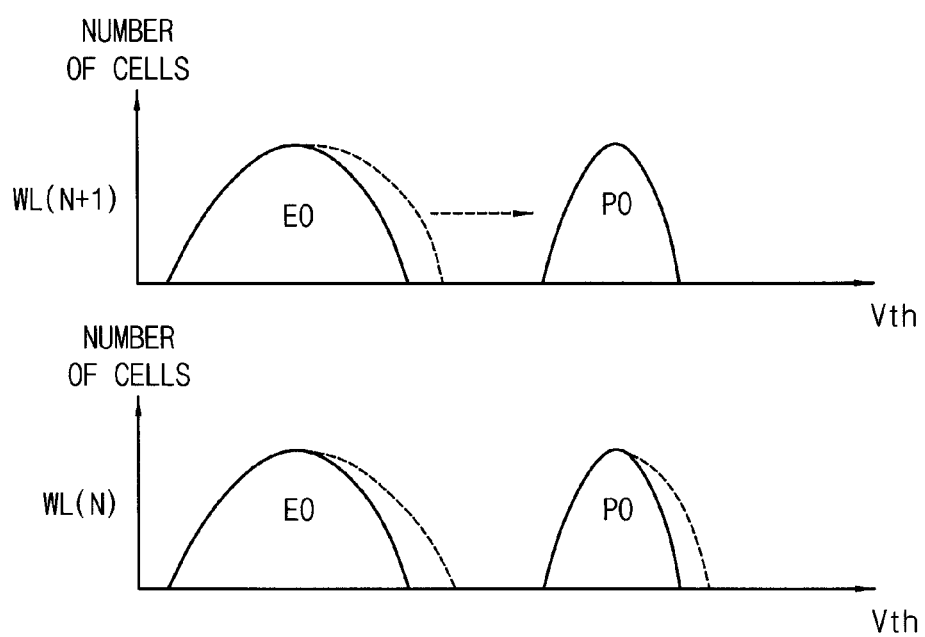

FIGS. 3A, 3B and 3C are diagrams illustrating example threshold voltage distributions by a program operation in a flash memory. FIGS. 3A, 3B and 3C show changes of the threshold voltage due to word line coupling during the program operation. As an example, the threshold voltage distributions of one-bit program or the SLC are illustrated in FIGS. 3A, 3B and 3C. The horizontal axis represents the threshold voltage Vth and the vertical axis represents the number of cells.

Referring to FIG. 3A, the memory cells of the selected word line WL(N) and the adjacent word line WL(N+1) are in the erase state E0 before the program operation is performed. When the program is performed with respect to the word line WL(N), the programmed memory cells of the word line WL(N) move from the E0 state to the P0 state as illustrated in FIG. 3B. In this case, the change of the threshold voltages of the memory cells coupled to the word line WL(N) influences on the memory cells coupled to the word line WL(N+1). As a result, the E0 state of the memory cells coupled to the word line WL(N+1) is broadened as represented by the dotted line in FIG. 3B. When the program is performed with respect to the word line WL(N+1), the programmed memory cells of the word line WL(N+1) move from the E0 state to the P0 state as illustrated in FIG. 3C. In this case, the change of the threshold voltages of the memory cells coupled to the word line WL(N+1) influences on the memory cells coupled to the word line WL(N). As a result, the E0 state and the P0 state of the memory cells coupled to the word line WL(N) is broadened as represented by the dotted line in FIG. 3B. When the distributions of the E0 and P0 states are broadened for the memory cells coupled to the program-completed word line WL(N), the read margin is reduced and thus the read error may be increased. According to at least some example embodiments of the inventive concepts of the inventive concepts, the word line coupling on the program-completed word line by the program of the adjacent word line may be reduced to enhance the reliability of the read operation.

Figure 4A:
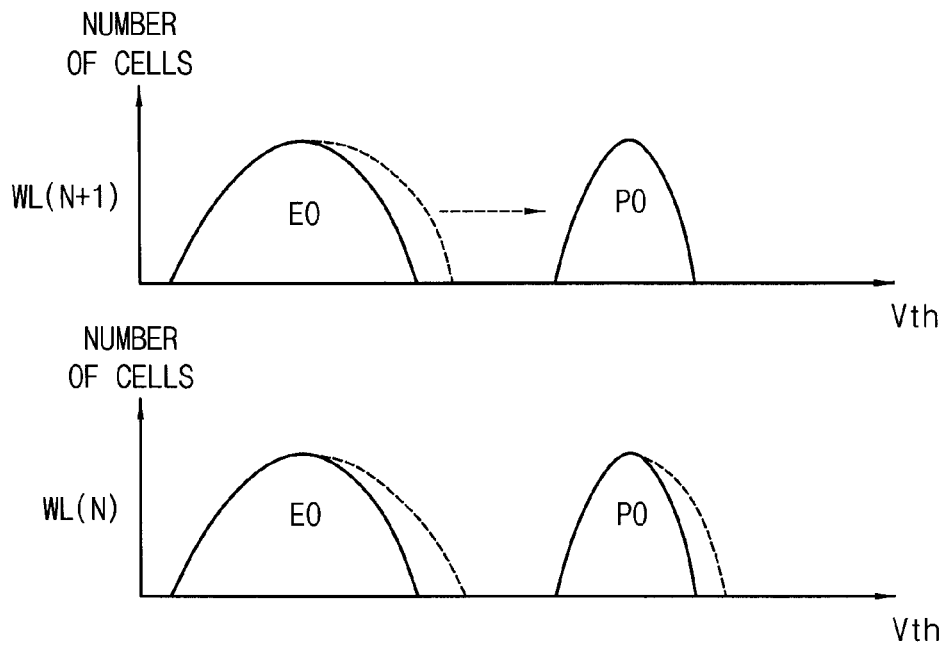
FIGS. 4A and 4B are diagrams illustrating example threshold voltage distributions by a reprogram operation in a flash memory.
Figure 4B:
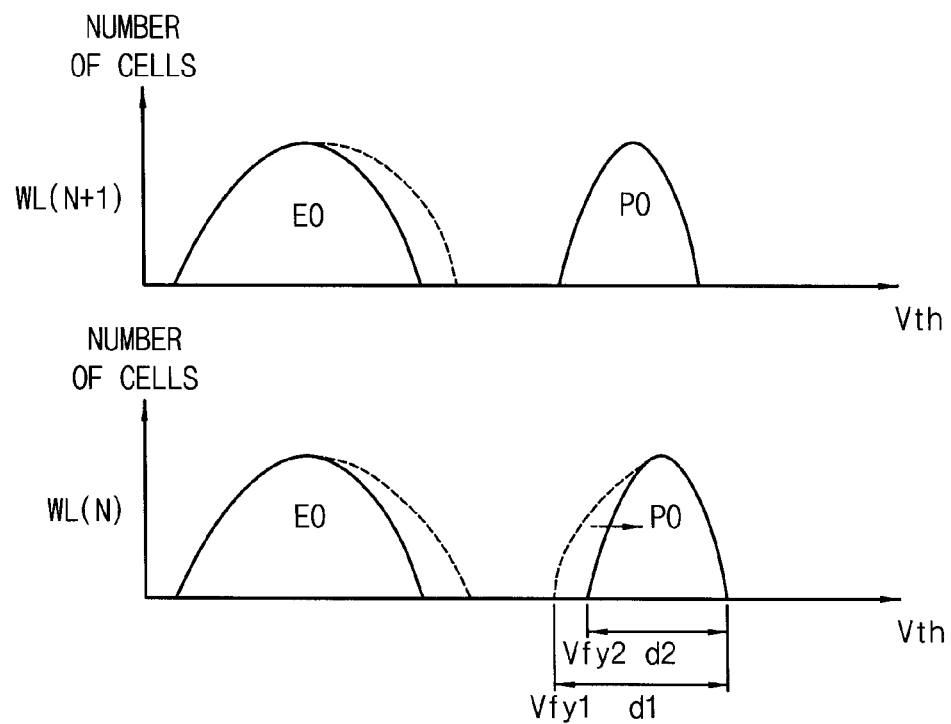

FIGS. 4A and 4B are diagrams illustrating example threshold voltage distributions by a reprogram operation in a flash memory.

FIG. 4A illustrates the same distribution as FIG. 3B before reprogramming the word line WL(N). Referring to FIG. 4B, the reprogram operation may be performed to compensate for the word line coupling on the word line WL(N) by the program of the word line WL(N+1). The reprogram operation is programming the selected word line WL(N) again using the higher verification voltage. For example, if the verification voltage Vvfy1 of the original program is 1.0V, the verification voltage Vvfy2 of the reprogram may be 1.2 V. As a result, the width of the P0 state may be reduced from d1 to d2 as the increase of the verification voltage. Even though the reprogram may compensate for the coupling effect by reducing the width of the programmed state P0, the operation time is increased significantly and thus the performance of the flash memory device may be degraded.

FIGS. 5A, 5B, 5C and 5D are diagrams illustrating example threshold voltage distributions by a data writing method adopting a partial program according to at least some example embodiments of the inventive concepts.

Figure 5A:
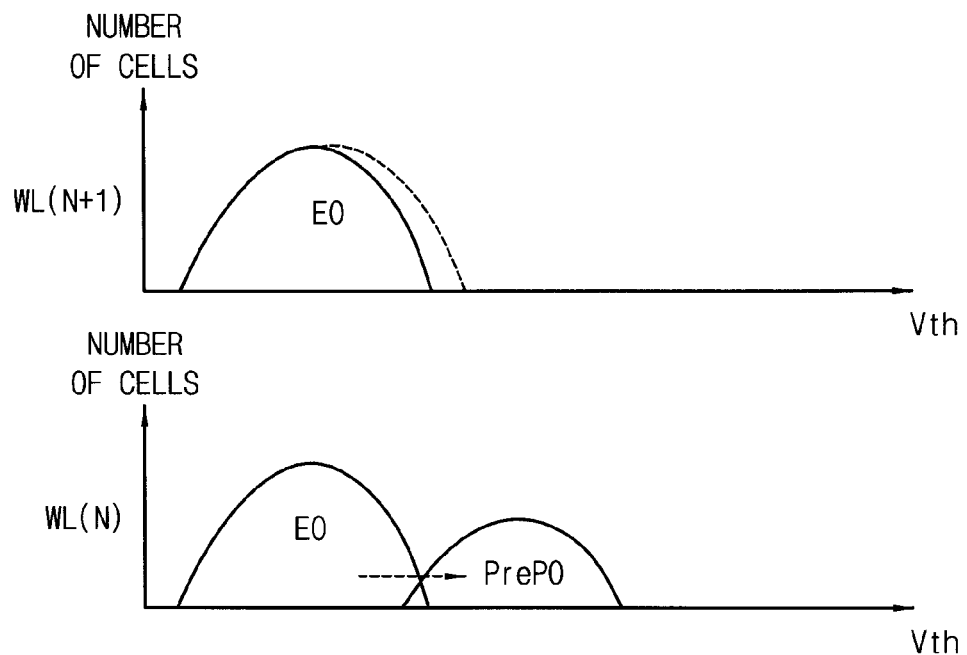
FIGS. 5A, 5B, 5C, 5D, 6A, 6B and 6C are diagrams illustrating example threshold voltage distributions by a data writing method adopting a partial program according to example embodiments of the inventive concepts.

FIG. 5A illustrates the threshold voltage distributions after the program pulse of the first program loop is applied to the word line WL(N). The application of the one program pulse to move the threshold voltages of the target memory cells may be referred to as a partial program. A program loop includes application of one program pulse and application of one verification pulse, and the program operation is performed through a plurality of program loops. If the verification result indicates the verification fail, the program voltage is increased according to ISPP and the next program loop with the same verification voltage is further performed. If the verification result indicates the verification success, the next program loop is not performed and the program operation is completed. The memory cells in the erased state E0 move to the partial-programmed state PreP0 by the partial program, that is, the application of the one program pulse. In this case, the change of the threshold voltage may be greatest compared to other incremental changes in the threshold voltage that will occur during an ISPP programming process, and thus the coupling effect on the adjacent word line WL(N+1) may be greatest. The erased state E0 of the memory cells coupled to the word line WL(N+1) is broadened as represented by the dotted line in FIG. 5A after the program pulse of the first program loop is applied to the word line WL(N).

Figure 5B:
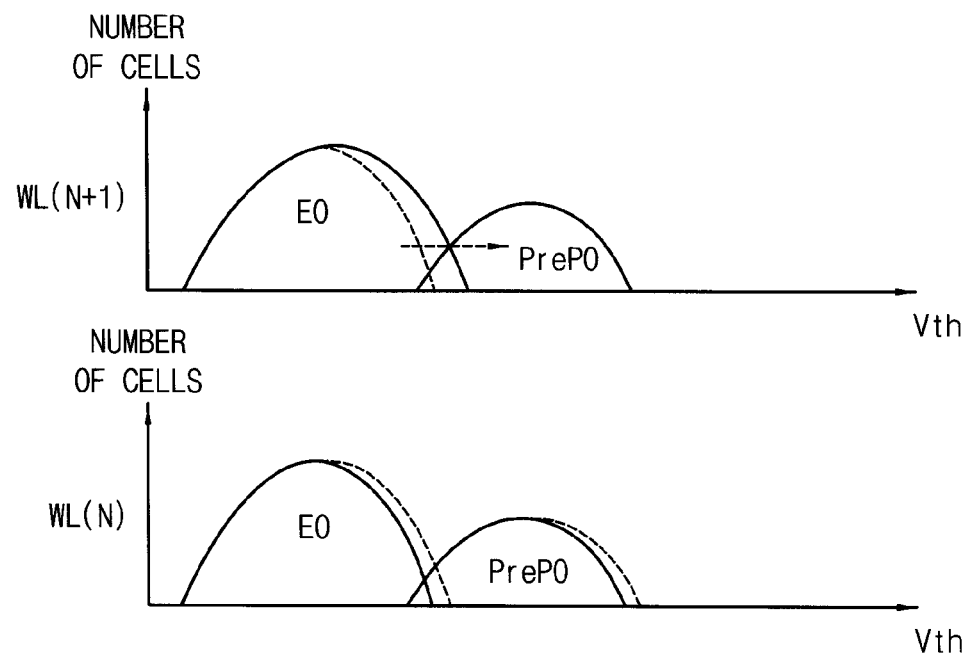

After such partial program with respect to the word line WL(N), without the verification of the first program loop of the word line WL(N), the partial program is programmed with respect to the adjacent word line WL(N+1) as illustrated in FIG. 5B by applying the program pulse of the first program loop. The target memory cells coupled to the word line WL(N+1) move from the erased state E0 to the partial-programmed state PreP0 by the partial program. As the target memory cells coupled to the adjacent word line WL(N+1) is changed, the states E0 and PreP0 of the memory cells coupled to the selected word line WL(N) are broadened as represented by the dotted lines.

Figure 5C:
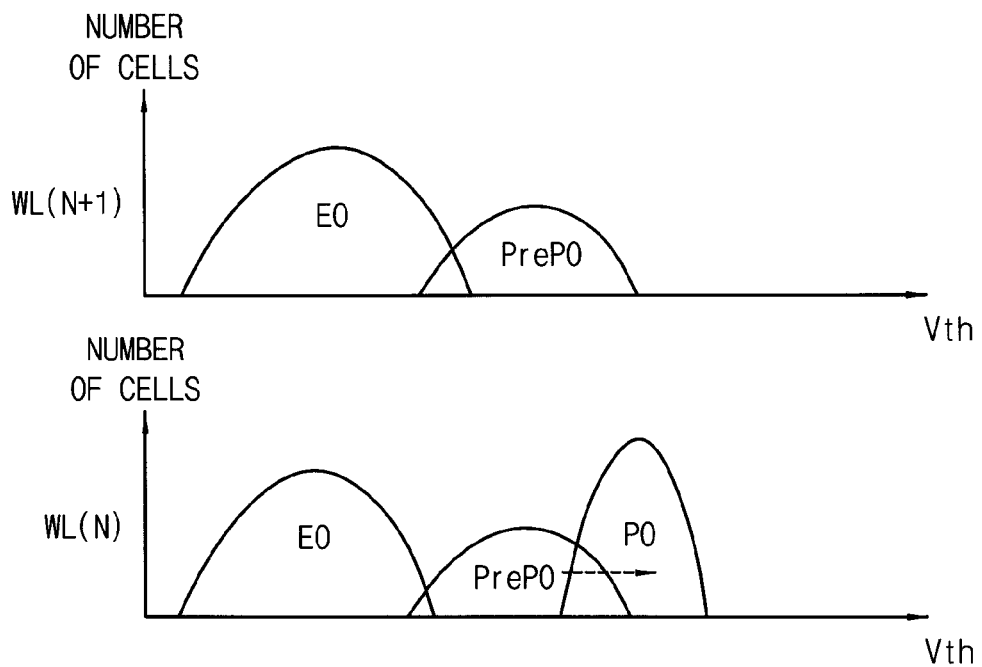

After the partial program with respect to the adjacent word line WL(N+1), the verification is performed with respect to the partial-programmed memory cells coupled to the selected word line WL(N). If the verification result indicates the verification fail, an additional program is performed with respect to the selected word line WL(N) so that the target memory cells coupled to the selected word line WL(N) may have the final-programmed state P0 as illustrated in FIG. 5C.

Figure 5D:
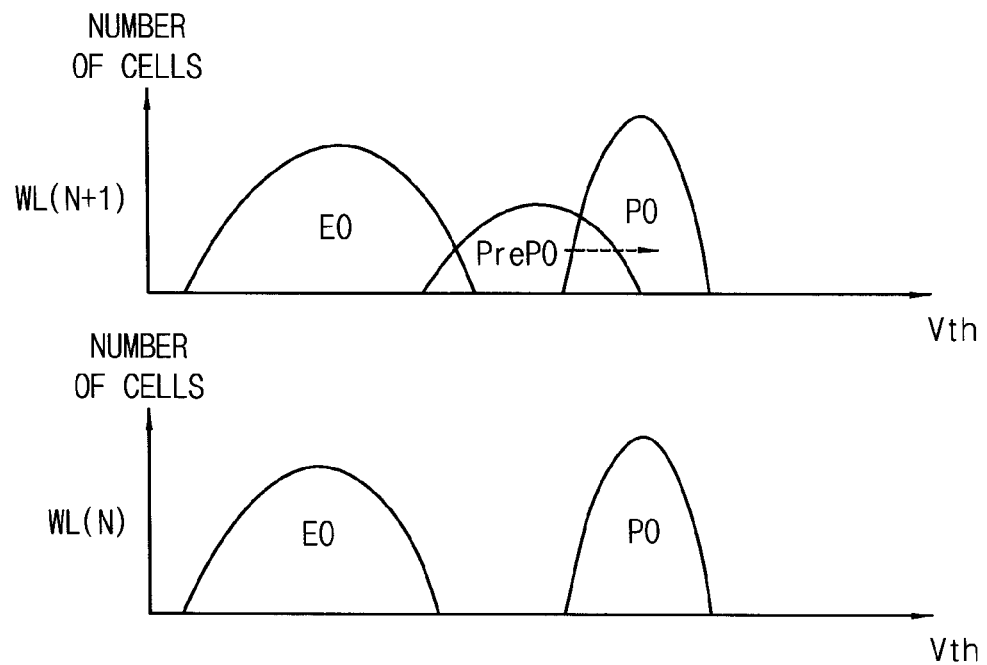

FIG. 5D illustrates the threshold voltage distributions after the target memory cells coupled to the word line WL(N+1) are programmed finally. Since the target memory cells coupled to the word line WL(N+1) moved to the partial-programmed state PreP0 in advance, the target memory cells coupled to the word line WL(N+1) move from the partial-programmed state PreP0 to the final-programmed state P0 by the addition program with respect to the word line WL(N+1). As such, the change of the threshold voltage is reduced and the coupling effect of the program-completed word line WL(N) by the program of the adjacent word line WL(N+1) may be reduced significantly. Even though it is described that the partial program with respect to the adjacent word line is performed during the first program loop of the selected word line, the partial program may be performed during the second or other program loop.

Figure 6A:
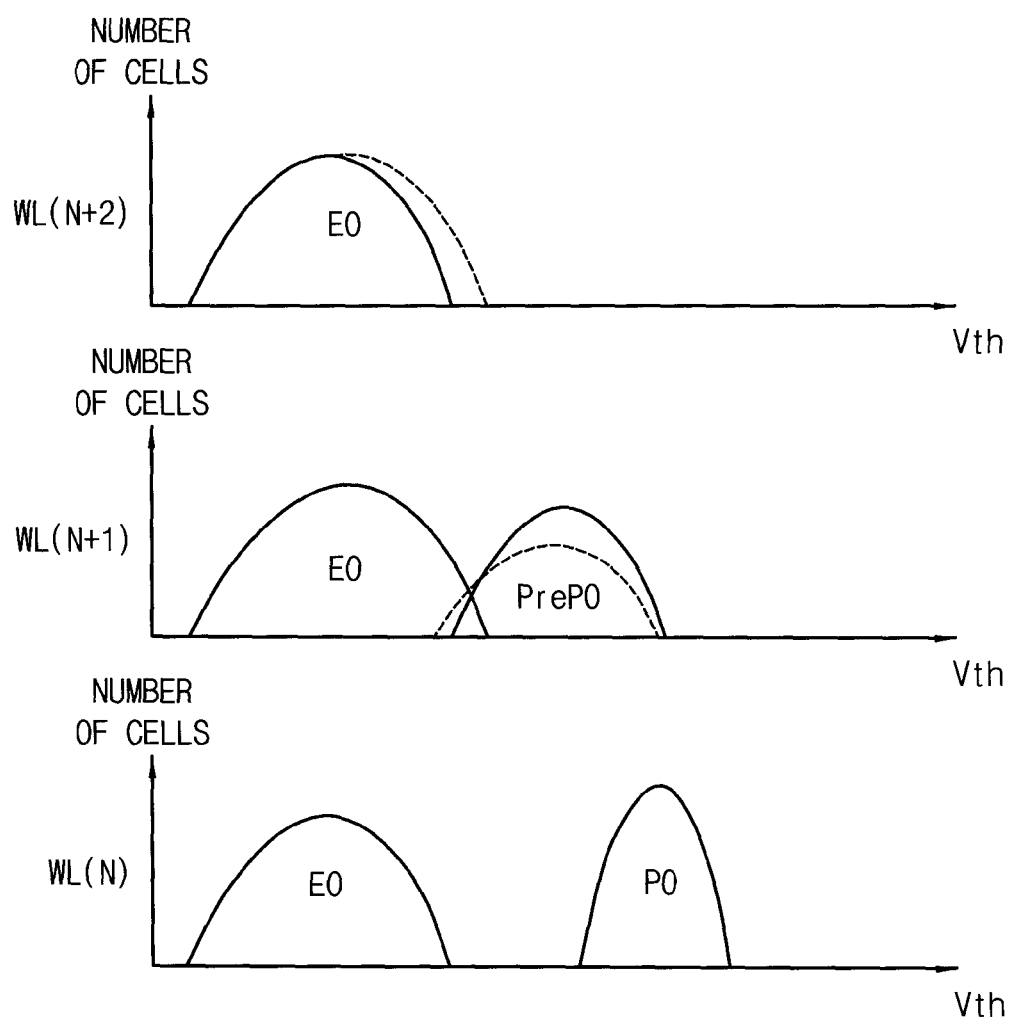
Figure 6B:
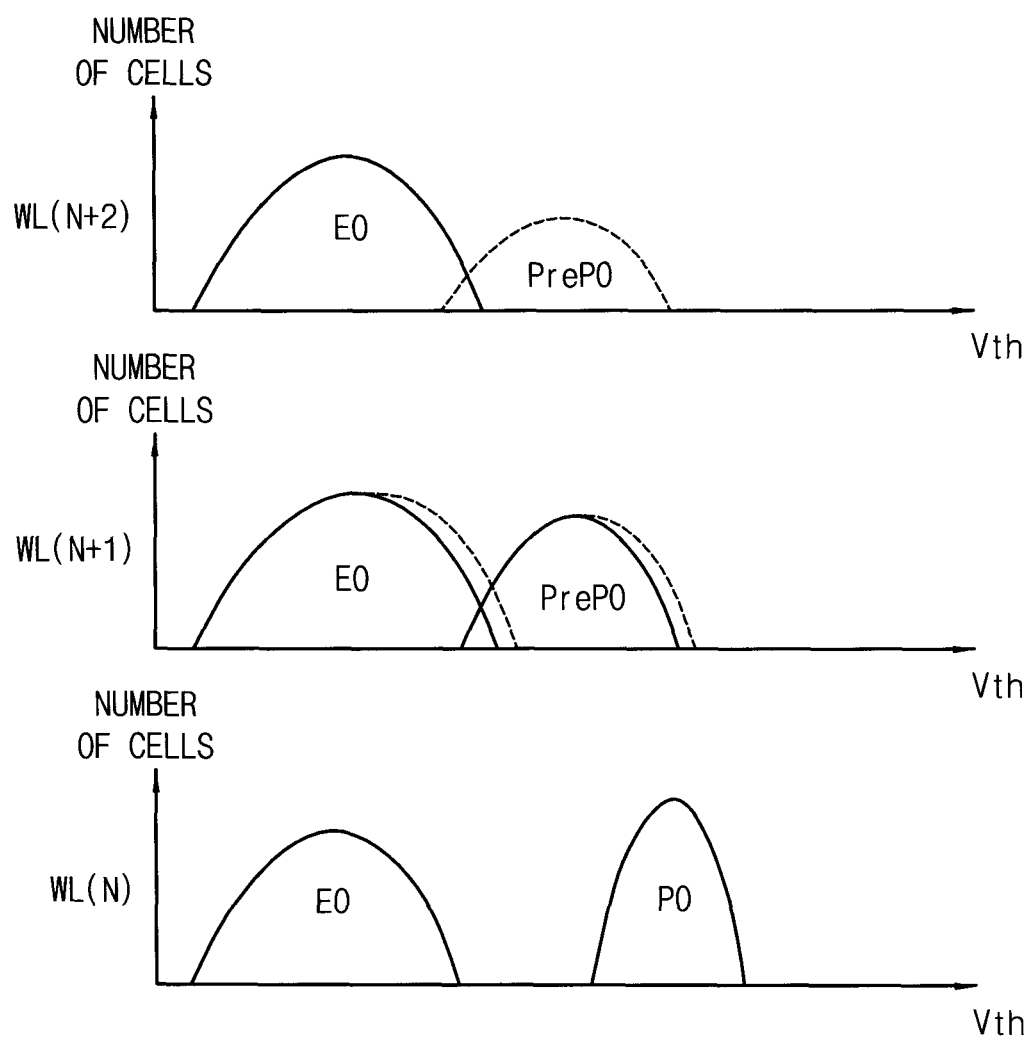
Figure 6C:
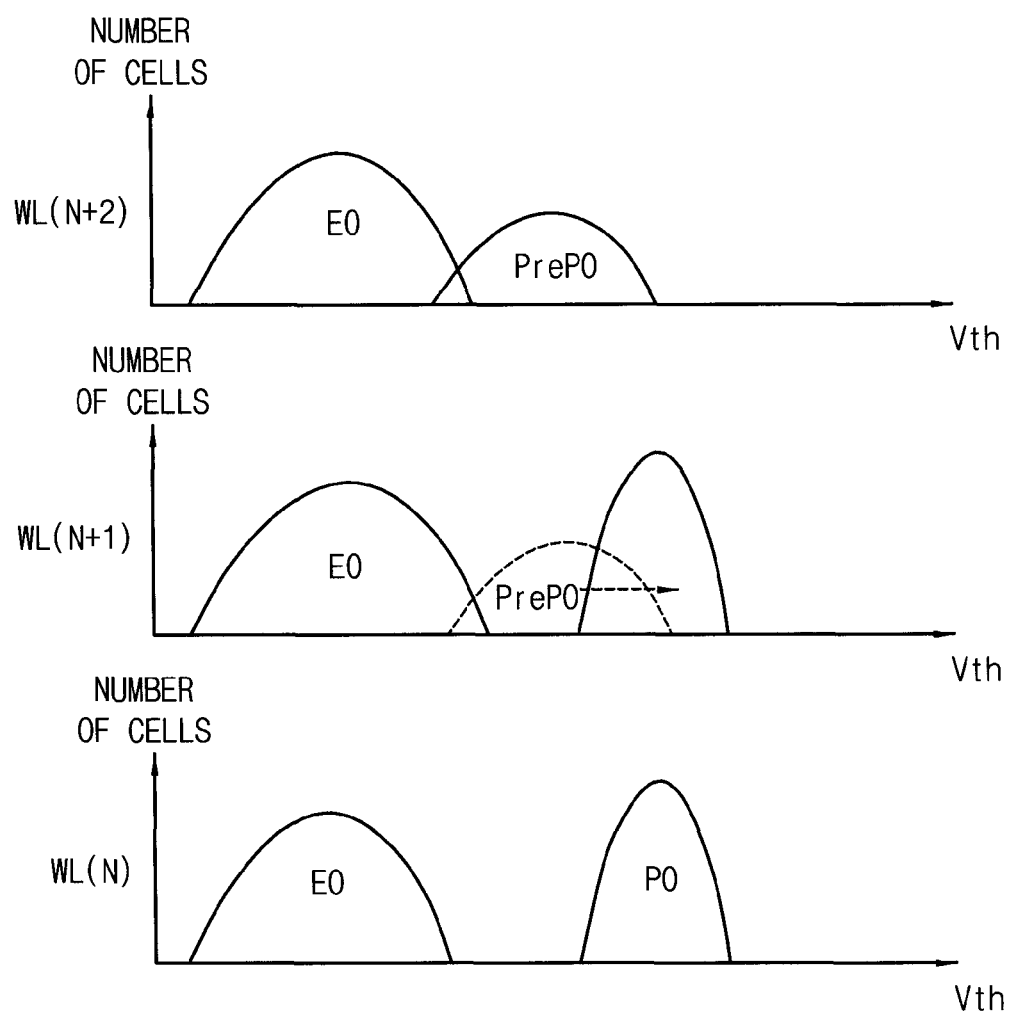

FIGS. 6A, 6B and 6C are diagrams illustrating example threshold voltage distributions by a data writing method adopting a partial program according to at least some example embodiments of the inventive concepts.

FIG. 6A illustrates that the target memory cells of the word line WL(N) are in the final-programmed state P0 and the target memory cells of the word line WL(N+1) are in the partial-programmed state PreP0. According to the next program command, the word line WL(N+1) is selected to be programmed. When the partial program is performed with respect to the selected word line WL(N+1) and the partial-programmed state PreP0 of the word line WL(N+1) is changed from the dotted line to the solid line. Also the erased state E0 of the adjacent word line WL(N+1) is broadened from the solid line to the dotted line.

As illustrated in FIG. 6B, the partial program is performed with respect to the adjacent word line WL(N+2) so that the target memory cells coupled to the word line WL(N+2) may move from the erased state E0 to the partial-programmed state PreP0. As described above, the states E0 and PreP0 of the word line WL(N+1) are broadened as represented by the dotted lines due to the coupling effect by the partial program of the word line WL(N+2).

After the partial program with respect to the adjacent word line WL(N+2), the verification is performed with respect to the partial-programmed memory cells coupled to the selected word line WL(N+1). If the verification result indicates the verification fail, an additional program is performed with respect to the selected word line WL(N+1) so that the target memory cells coupled to the selected word line WL(N+1) may have the final-programmed state P0 as illustrated in FIG. 6C. As described above, the additional program may be performed according to ISPP. Even though it is described that the partial program with respect to the adjacent word line is performed during the first program loop of the selected word line, the partial program may be performed during the second or other program loop. The partial program loop with respect to the word line WL(N+1) as illustrated in FIG. 6A may be omitted in some embodiments.

Figure 7:
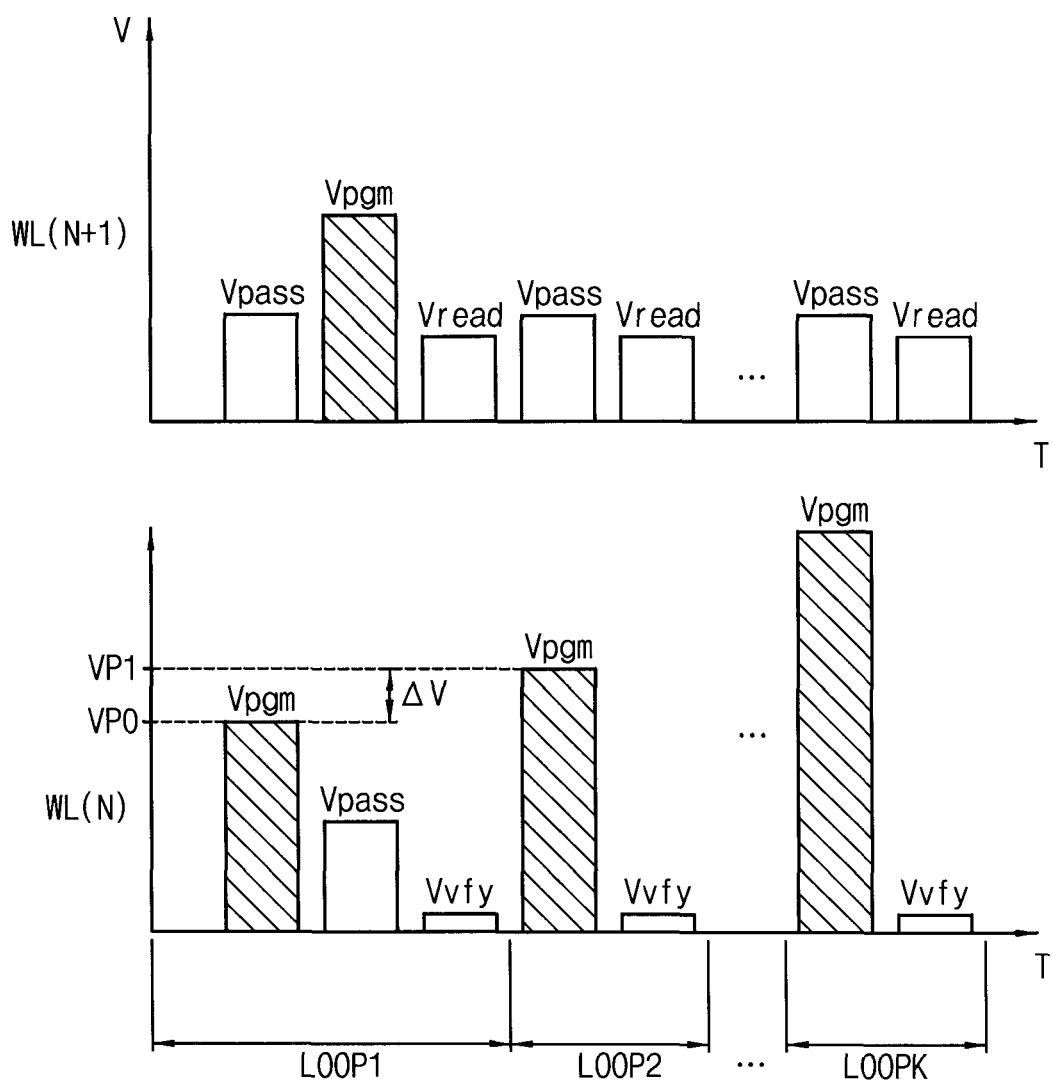
FIG. 7 is a diagram illustrating example voltages used in a data writing method adopting a partial program according to example embodiments of the inventive concepts.

FIG. 7 is a diagram illustrating example voltages used in a data writing method adopting a partial program according to at least some example embodiments of the inventive concepts. In FIG. 7, the horizontal axis represents a time T and the vertical axis represents a voltage V.

Referring to FIG. 7, in the first program loop LOOP1, the partial program is performed with respect to the selected word line WL(N) by applying the program voltage Vpgm of the voltage level VP0 to the selected word line WL(N) with applying the pass voltage Vpass to the adjacent word line WL(N+1). After the partial program of the selected word line WL(N), the partial program is performed with respect to the adjacent word line WL(N+1) by applying the program voltage Vpgm of the voltage level P0 to the adjacent word line WL(N+1) with applying the pass voltage Vpass to the selected word line WL(N). The verification voltage Vvfy is applied to the selected word line WL(N) to determine the threshold voltages of the target memory cells coupled to the selected word line WL(N) reach the target level.

If the memory cells of the verification fail exist in the selected word line WL(N), the additional program is performed. The additional program may be performed using the program loops with increasing the level of the program voltage Vpgm by the voltage interval $\Delta V = P1 - P0$.

The additional program may be performed by alternatively applying the verification voltage Vvfy and each of the pulse voltages Vpgm to the selected word line WL(N) based on verification results of the additional program. The program loops LOOP2 to LOOPK may be performed sequentially until all of the target memory cells coupled to the selected word line are verified as being programmed successfully. The level of the program voltage Vpgm may be increased sequentially by the voltage interval $\Delta V$ according to ISPP.

As such, the partial program may be performed by applying the first program voltage VP0 to the selected word line WL(N) and the adjacent word line WL(N+1), and the additional program may be performed by applying pulse voltages to the first word line WL(N), where the pulse voltages increase sequentially from the second program voltage VP1 greater than the first program voltage VP0.

Figure 8:
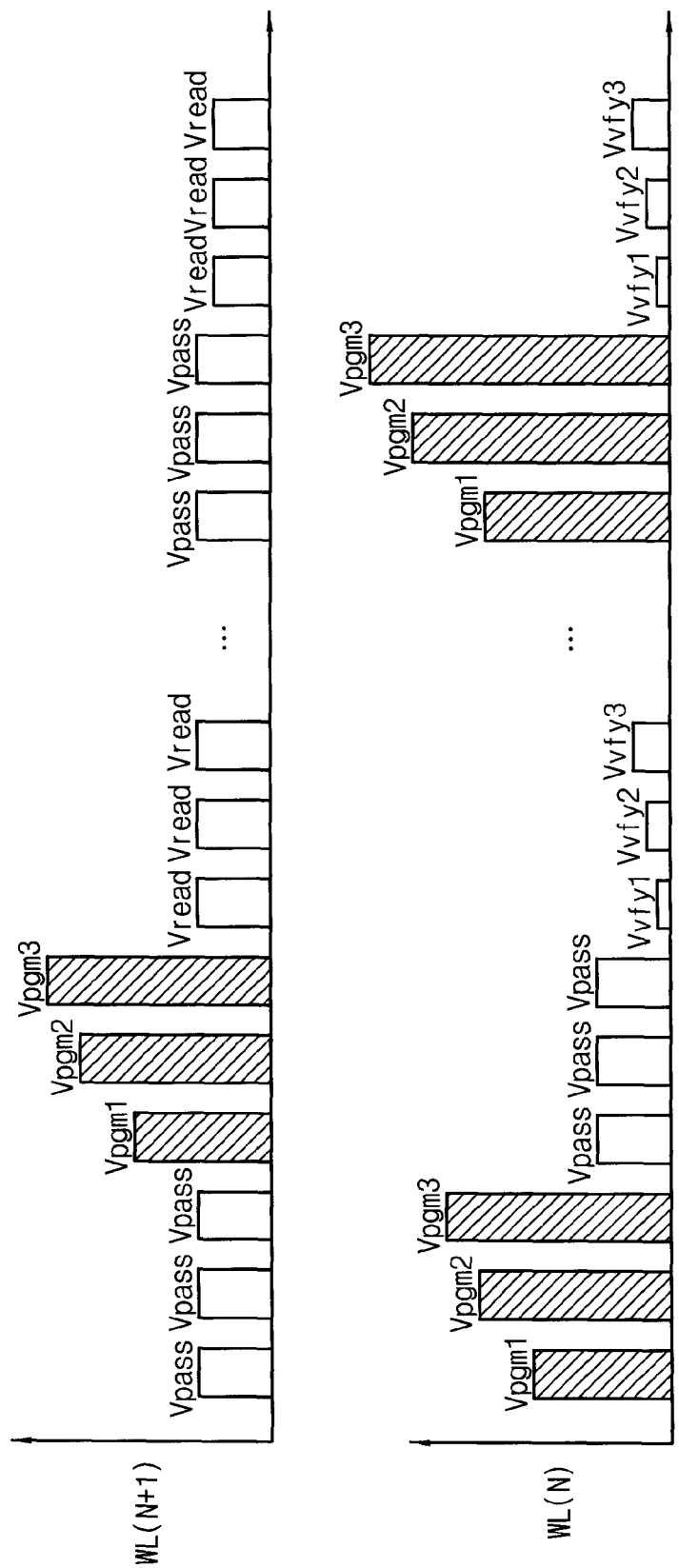
FIG. 8 is a diagram illustrating example voltages used in writing data in multi level cells adopting a partial program according to example embodiments of the inventive concepts.

FIG. 8 is a diagram illustrating example voltages used in writing data in multi-level cells adopting a partial program according to at least some example embodiments of the inventive concepts. In FIG. 8, the horizontal axis represents a time T and the vertical axis represents a voltage V.

Referring to FIG. 8, the program voltages Vpgm1~Vpgm3 are applied to the selected word line WL(N) with applying the pass voltage Vpass to the adjacent word line WL(N+1). The program voltages Vpgm1~Vpgm3 are for programming the multi bits to increase the threshold voltage of the memory cells to the respective levels. For example, the first program voltage Vpgm1 may be a program pulse for programming the state '10', the second program voltage Vpgm2 may be a program pulse for programming the state '01' and the third program voltage Vpgm3 may be a program pulse for programming the state '00'. As such, the $2^{N-1}$ (e.g., N=2) pulse voltages corresponding to the states '10', '01', '00' except the erased state '11' may be referred to as a first program voltage pulse set.

After performing the partial program with respect to the selected word line WL(N) by applying the program voltages Vpgm1~Vpgm3 to the selected word line WL(N), the partial program with respect to the adjacent word line WL(N+1) is performed by applying the program voltages Vpgm1~Vpgm3 to the adjacent word line WL(N+1). After the partial program with respect to the adjacent word line WL(N+1), the verification voltages Vvfy1~Vvfy3 are applied sequentially to the selected word line WL(N). The verification voltages Vvfy1~Vvfy3 are for verifying the multi bits to determine whether the threshold voltages of the memory cells reach the respective target levels. As such the $2^{N-1}$ (e.g., N=2) verification voltages corresponding to the states '10', '01', '00' except the erased state '11' may be referred to as a verification voltage pulse set.

If the memory cells of the verification fail exist in the selected word line WL(N), the additional program is performed. The program voltages Vpgm1~Vpgm3 having increased voltage level by the voltage interval $\Delta V$ and the verification voltages Vvfy1~Vvfy3 may be applied sequentially to the selected word line WL(N).

Until the verification result indicates that all of the target memory cells are programmed successfully, the program voltages Vpgm1~Vpgm3 and the verification voltages Vvfy1~Vvfy3 are applied repeatedly. As the program loops are repeated, the voltage levels of the program voltages Vpgm1~Vpgm3 may be increased by the voltage interval $\Delta V$ according to ISPP. As such, the $2^{N-1}$ pulse voltages corresponding to the states '10', '01', '00' and increasing sequentially from the voltage levels greater than the 2N−1 pulse voltages of the first program voltage pulse set may be referred to as a second program voltage pulse set.

Even though writing of the MLC storing two bits is described as an example, the method of writing data adopting the partial program may be applied to the MLC storing three or more bits.

Figure 9:
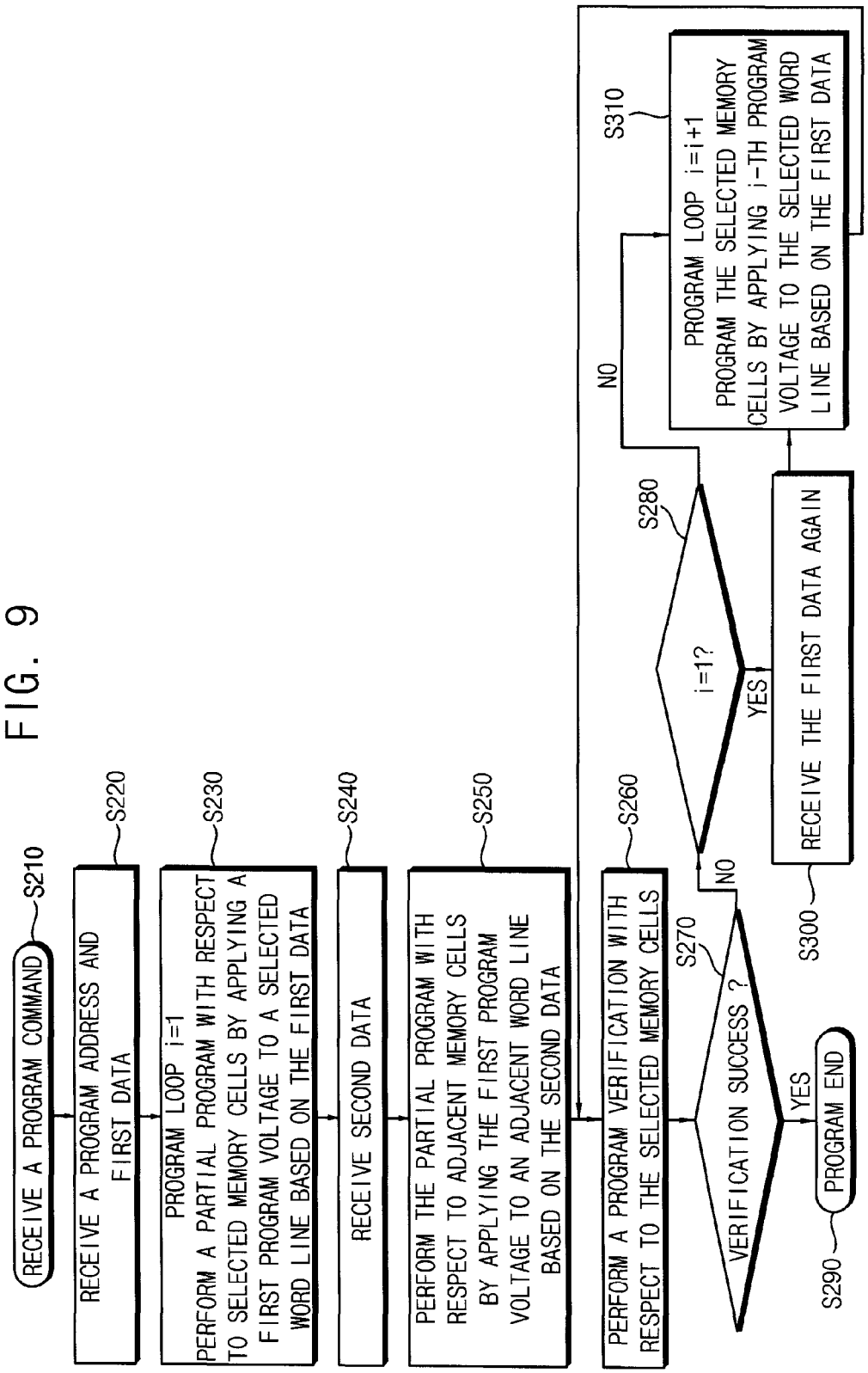
FIG. 9 is a flowchart illustrating a method of writing data in a non-volatile memory device according to example embodiments of the inventive concepts.

FIG. 9 is a flowchart illustrating a method of writing data in a non-volatile memory device according to at least some example embodiments of the inventive concepts. FIG. 9 illustrates the embodiments that data are received respectively for the partial program and the additional program.

Referring to FIG. 9, the flash memory may be programmed through steps S210 through S310.

Figure 10:
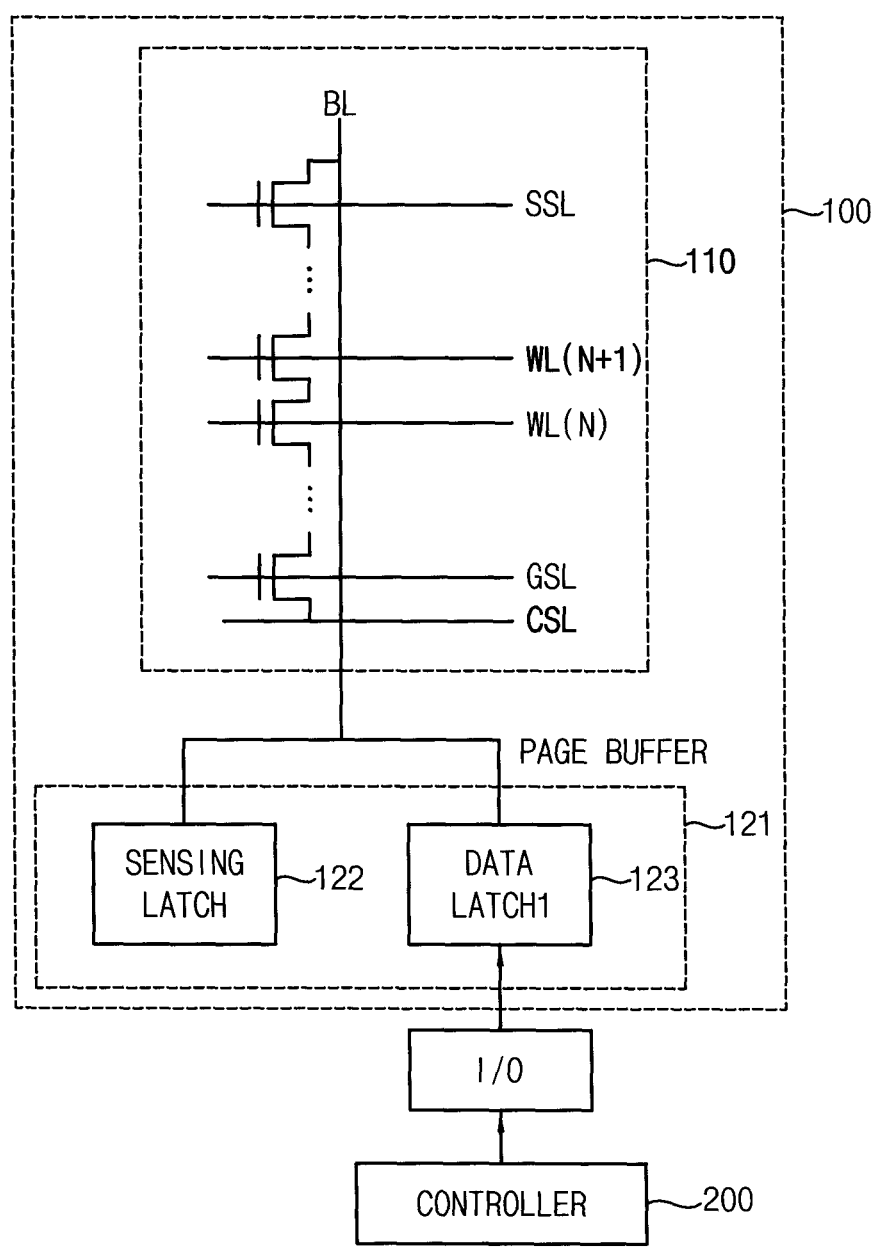
FIG. 10 is a diagram for describing a data loading operation for the method of FIG. 9.

In step S210, the flash memory device 100 of FIG. 2A may receive a program command from an external device such as a memory controller 200 of FIG. 10.

In step S220, the flash memory device 100 may receive a program address and first data from the external device. The received first data may be stored in a data latch. The data latch may be included in a page buffer in the read/write circuit 120 of FIGS. 2A and 2B.

In step S230, the flash memory device 100 may determine the selected word line according to the received program address. The program loop count (i) is set to one. The program loop count (i) is increased during the additional program. As described above, the partial program is performed with respect to the selected memory cells by applying a first program voltage to the selected word line WL(N) based on the first data. The first program voltage may be the program pulse of the first program loop LOOP1 and the first program voltage may be the lowest one of the program voltages.

In step S240, the flash memory device 100 may receive second data from the external device such as the memory controller 200. The received second data may be stored in the data latch. The data latch storing the first data may be reset to store the second data. In other words, the state of the data latch may be initialized to receive new data.

In step S250, the flash memory device 100 may perform the partial program with respect to the adjacent memory cells by applying the first program voltage to the adjacent word line WL(N+1) based on the second data. The first program of the partial program applied to the adjacent word line WL(N+1) may be the same as the program voltage of the partial program applied to the selected word line WL(N) in step 230.

In step S260, the flash memory device 100 may perform the program verification with respect to the selected memory cells coupled to the selected word line WL(N). As described above, the program verification is performed to determine whether the threshold voltages of the memory cells reach the target level.

In step S270, the flash memory device 100 determines whether the verification result indicates the verification success. If the verification result indicates the verification success, step S290 is performed and the program operation is ended. If the verification result indicates the verification fail, step S280 is performed.

In step S280, the flash memory device 100 determines whether the program loop count (i) is one or not. When the program loop count (i) is one, step S300 is performed. When the program loop count (i) is not one, step S310 is performed.

In step S300, the first data are received again from the external device for the additional program. The received first data may be stored in the data latch. The data latch storing the second data may be reset to store the first data. As described above, the state of the data latch may be initialized to receive new data.

In step S310, the program loop count (i) is increased by one. As the program loop count is increased, the program voltage may increase or decrease. For example, the program voltage may be 8.0V when the program loop count (i) is one, the program voltage may be 8.2V when the program loop count (i) is two, and the program voltage may be 8.4V when the program loop count (i) is three. The flash memory device 100 may program the selected memory cells by applying i-th program voltage to the selected word line WL(N) based on the first data. After applying the i-th program voltage, the program verification of step S260 is performed again.

FIG. 10 is a diagram for describing a data loading operation for the method of FIG. 9.

Referring to FIG. 10, a memory system 300 may include a flash memory device 100 and a controller 200. The flash memory device 100 may include a memory cell array 110 and a page buffer 121. The page buffer 121 may be included in the read/write circuit 120 in FIG. 2A. The page buffer 121 may include a sensing latch 122 and a data latch 123 coupled to a corresponding bit line BL. The data latch 123 may be coupled to an input/output block I/O for exchanging data with an external device such as the memory controller 200.

The controller 200 may transmit the program command, the address and the data, that is, the program address and the first data in FIG. 9, to the flash memory device 100.

The received first data is stored in the data latch 123. The flash memory device 100 determines the selected word line WL(N) based on the program address, and performs the partial program with respect to the selected word line WL(N).

For the partial program, a relatively low, or alternatively, lowest program voltage is applied to the selected word line WL(N) and the proper bit line voltage is applied to the bit line BL based on the data bit stored in the data latch 123. For example, the program voltage applied to the word line WL(N) may be a lowest one of a plurality of different voltages used in an ISPP process of the memory system 300. For example, the program permission voltage (e.g., 0V) may be applied to the bit line BL when the stored data bit is '0', and the program prohibition voltage (e.g., 1.8V) may be applied to the bit line BL when the stored data bit is '1'. The program permission and prohibition voltages may be determined variously.

When the partial program with respect to the selected word line WL(N) is completed, the controller 200 transmits the second data, which are to be programmed to the adjacent word line WL(N+1), to the flash memory device 100.

The second data is stored in the data latch 123 for the partial program with respect to the adjacent word line WL(N+1). The state of the data latch 123 may be initialized to receive and store the second data. Based on the second data stored in the data latch 123, the partial program is performed with respect to the adjacent word line WL(N+1) as described above.

When the partial program with respect to the adjacent word line WL(N+1) is completed, the verification of the partial program with respect to the selected word line WL(N) is performed using the sensing latch 122. If the verification result indicates the verification fail, the controller 200 transmits the first data to the flash memory device 100 for the additional program with respect to the selected word line WL(N).

The page buffer 121 stores the retransmitted first data in the data latch 123. The state of the data latch 123 may be initialized to store the retransmitted first data. The flash memory device 100 may perform the additional program with respect to the selected word line WL(N) based on the stored first data.

In case of the embodiments of FIGS. 9 and 10, the partial program with respect to the adjacent word line may be performed to reduce the coupling effect without the additional data latch and thus the size of the flash memory device may be reduced.

Figure 11:
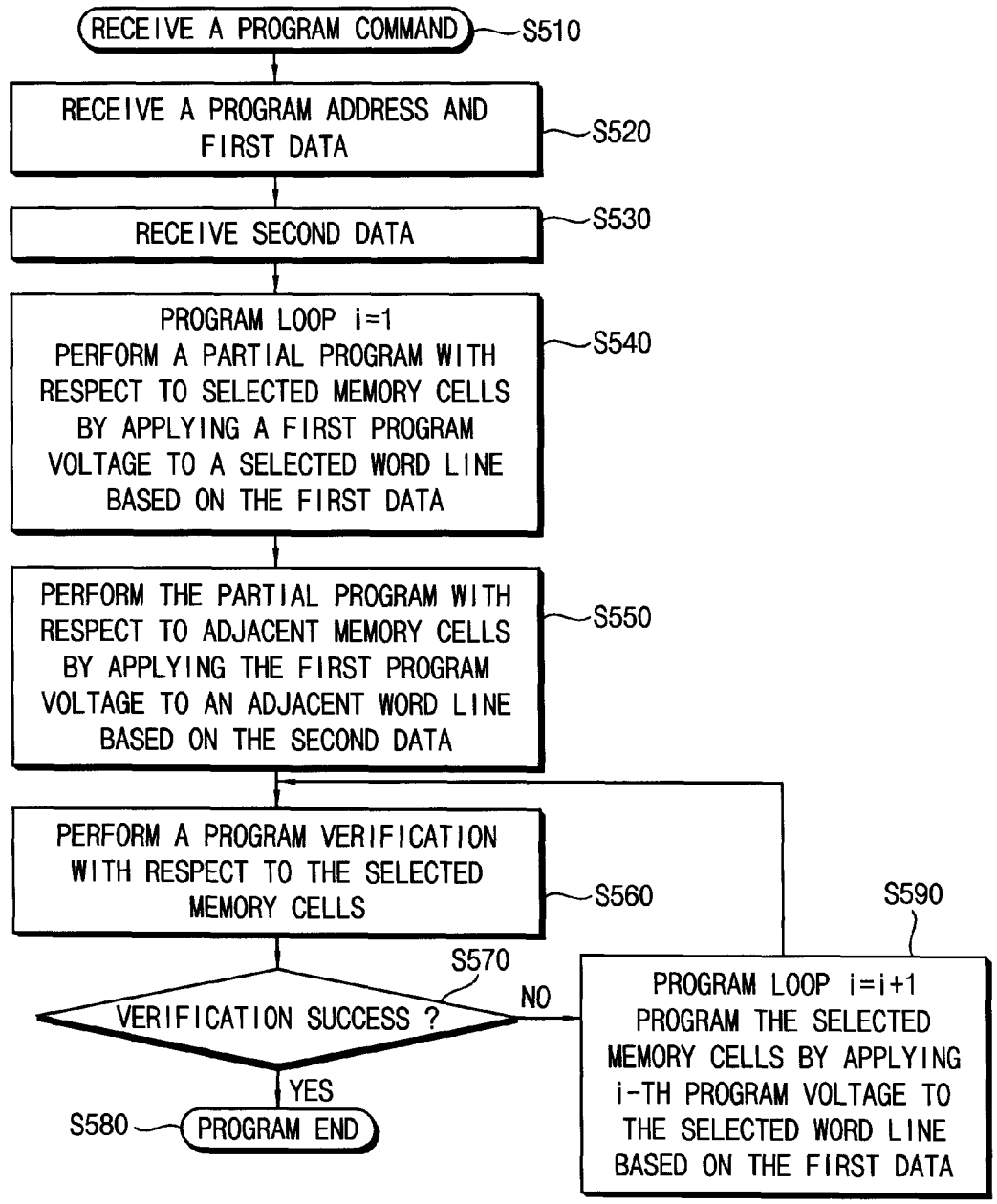
FIG. 11 is a flowchart illustrating a method of writing data in a non-volatile memory device according to example embodiments of the inventive concepts.

FIG. 11 is a flowchart illustrating a method of writing data in a non-volatile memory device according to at least some example embodiments of the inventive concepts. FIG. 11 illustrates the embodiments that data are received sequentially for the partial program and the additional program.

Referring to FIG. 11, the flash memory may be programmed through steps S510 through S590.

Figure 12:
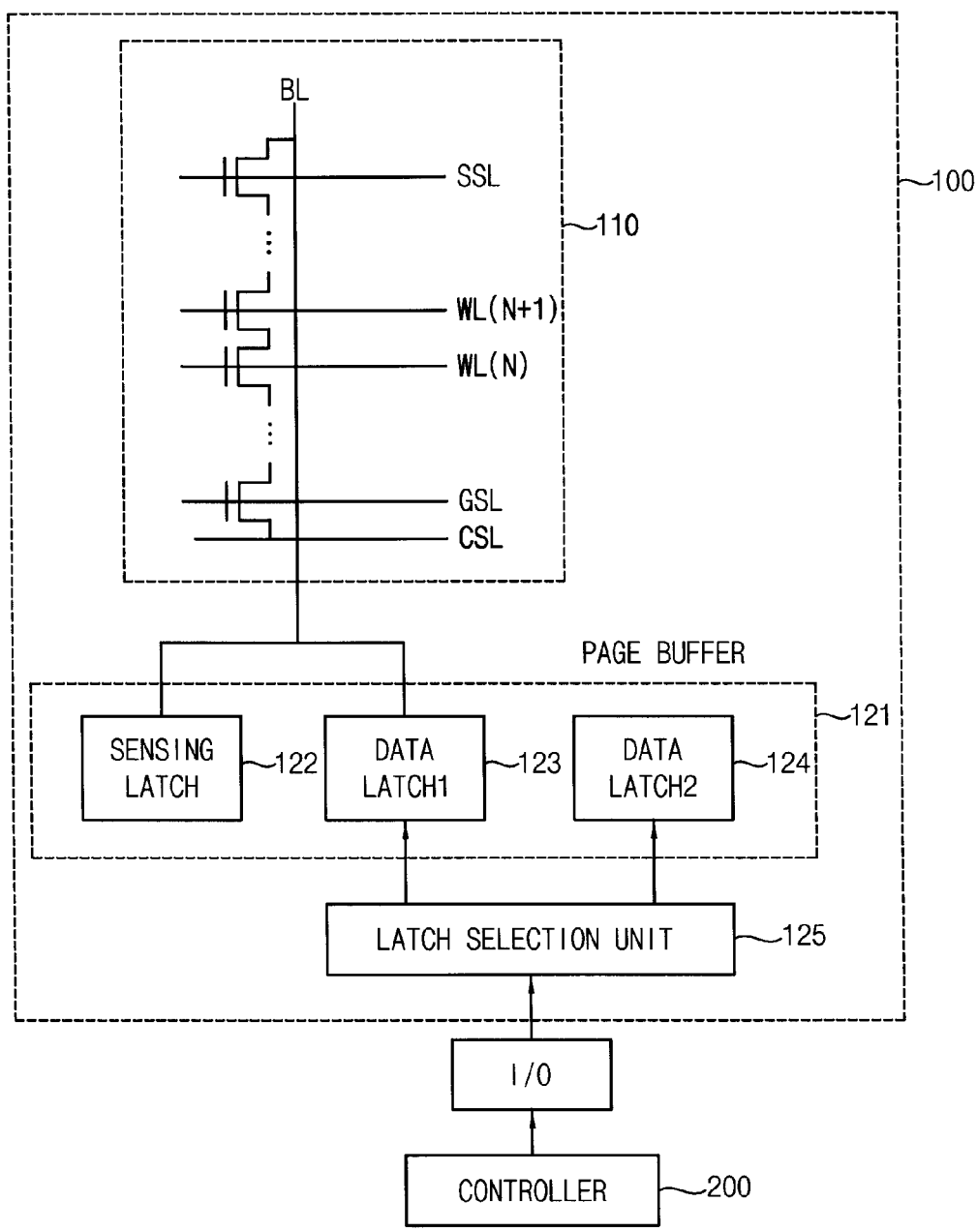
FIG. 12 is a diagram for describing a data loading operation for the method of FIG. 11.

In step S510, the flash memory device 100 of FIG. 2A may receive a program command from an external device such as a memory controller 200 of FIG. 12.

In step S520, the flash memory device 100 may receive a program address and first data from the external device. The received first data may be stored in a first data latch. The first data latch may be included in a page buffer in the read/write circuit 120 of FIGS. 2A and 2B.

In step 530, the flash memory device 100 may receive second data from the external device. The received second data may be stored in a second data latch. The second data latch may be included in the page buffer in the read/write circuit 120.

In step S540, the flash memory device 100 may determine the selected word line according to the received program address. The program loop count (i) is set to one. The program loop count (i) is increased during the additional program. As described above, the partial program is performed with respect to the selected memory cells by applying a first program voltage to the selected word line WL(N) based on the first data stored in the first data latch. The first program voltage may be the program pulse of the first program loop LOOP1 and the first program voltage may be the lowest one of the program voltages.

In step S550, the flash memory device 100 may perform the partial program with respect to the adjacent memory cells by applying the first program voltage to the adjacent word line WL(N+1) based on the second data stored in the second latch. The first program of the partial program applied to the adjacent word line WL(N+1) may be the same as the program voltage of the partial program applied to the selected word line WL(N) in step 540.

In step S560, the flash memory device 100 may perform the program verification with respect to the selected memory cells coupled to the selected word line WL(N). As described above, the program verification is performed to determine whether the threshold voltages of the memory cells reach the target level.

In step S570, the flash memory device 100 determines whether the verification result indicates the verification success. If the verification result indicates the verification success, step S590 is performed and the program operation is ended. If the verification result indicates the verification fail, step S590 is performed.

In step S590, the program loop count (i) is increased by one. As the program loop count is increased, the program voltage may be increases or decreases. For example, the program voltage may be 8.0V when the program loop count (i) is one, the program voltage may be 8.2V when the program loop count (i) is two, and the program voltage may be 8.4V when the program loop count (i) is three. The flash memory device 100 may program the selected memory cells by applying i-th program voltage to the selected word line WL(N) based on the first data. After applying the i-th program voltage, the program verification of step S560 is performed again.

FIG. 12 is a diagram for describing a data loading operation for the method of FIG. 11.

Referring to FIG. 12, a memory system 400 may include a flash memory device 100 and a controller 200. The flash memory device 100 may include a memory cell array 110, a page buffer 121, and a latch selection unit 125. The page buffer 121 and the latch selection unit 125 may be included in the read/write circuit 120 in FIG. 2A. The page buffer 121 may include a sensing latch 122 and a first data latch 123 and a second data latch 124 coupled to a corresponding bit line BL. The data latches 123 and 124 may be coupled to an input/output block I/O for exchanging data with an external device such as the memory controller 200.

The controller 200 may transmit the program command, the address and the data, that is, the program address and the first and second data in FIG. 11, to the flash memory device 100. The received first data are stored in the data latch 123 and the received second data are stored in the second latch 124.

The flash memory device 100 determines the selected word line WL(N) based on the program address, and performs the partial program with respect to the selected word line WL(N) based on the first data stored in the first data latch 123. The partial program is the same as described with reference to FIG. 10.

When the partial program with respect to the selected word line WL(N) is completed, the partial program is performed with respect to the adjacent word line WL(N+1) based on the second data stored in the second data latch 124.

When the partial program with respect to the adjacent word line WL(N+1) is completed, the verification of the partial program with respect to the selected word line WL(N) is performed using the sensing latch 122. If the verification result indicates the verification fail, the flash memory device 100 may perform the additional program with respect to the selected word line WL(N) based on the first data stored in the first latch 123.

In case of the embodiments of FIGS. 11 and 12, the time of reloading the first data may be omitted and the program speed may be enhanced.

Figure 13:
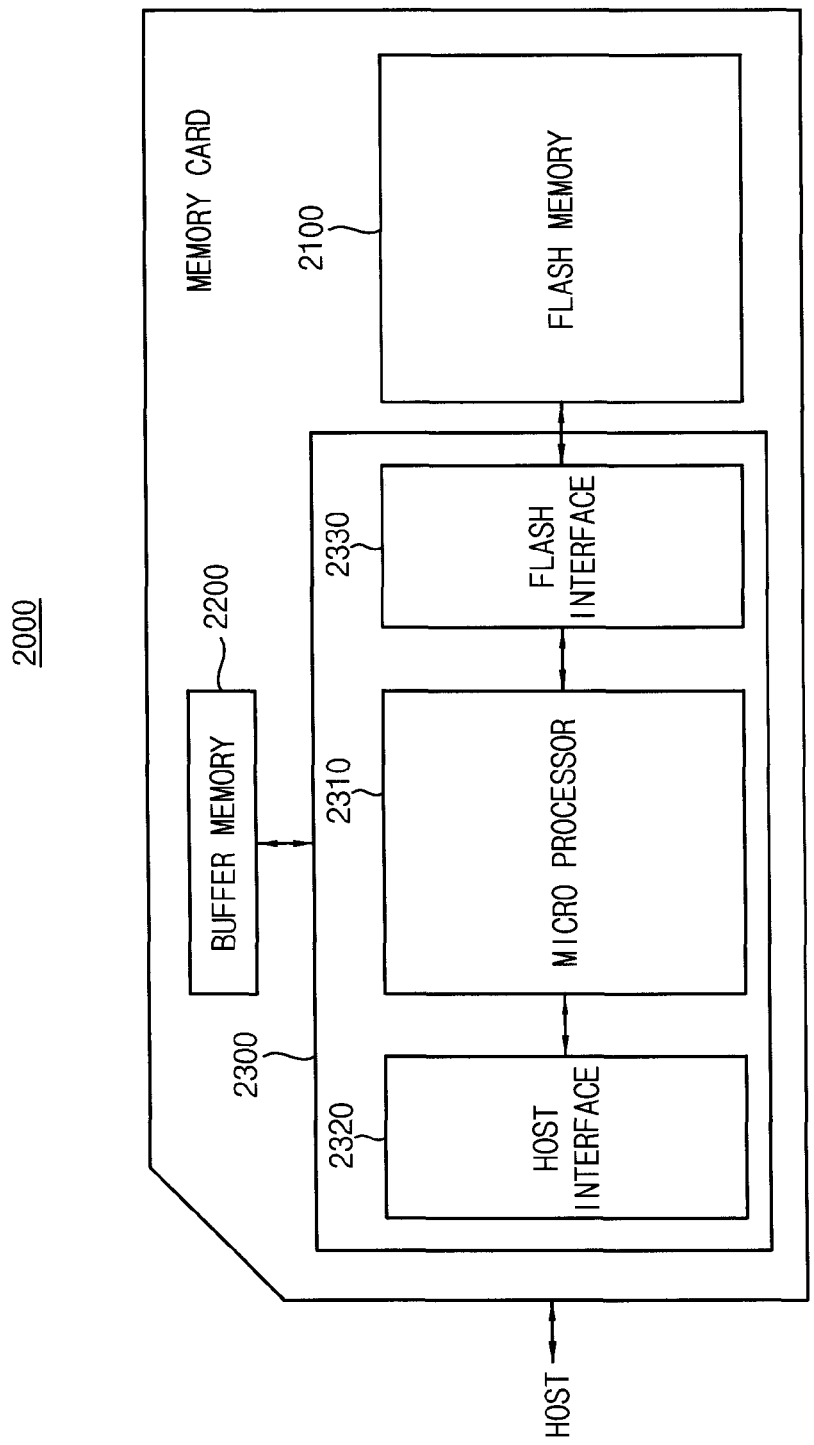
FIG. 13 is a block diagram illustrating a memory card according to example embodiments of the inventive concepts.

FIG. 13 is a block diagram illustrating a memory card according to at least some example embodiments of the inventive concepts.

Referring to FIG. 13, a memory card 2000 may include at least one flash memory 2100, a buffer memory 2200, and a memory controller 2300 for controlling the flash memory 2100 and the buffer memory 2200.

The flash memory device 2100 may be implemented in the same or substantially the same manner as the flash memory device 100 discussed above with reference to FIGS. 2A-12.

The buffer memory device 2200 may be used to temporarily store data generated during the operation of the memory card 2000. The buffer memory device 2200 may be implemented using a dynamic random access memory (DRAM) or a static random access memory (SRAM).

The memory controller 2300 may be connected between a host and the flash memory 2100. The memory controller 2300 may be configured to access the flash memory 2100 in response to a request from the host.

The memory controller 2300 may include at least one microprocessor 2310, a host interface 2320, and a flash interface 2330.

The microprocessor 2310 may be configured to drive firmware. The host interface 2320 may interface with the host via a card (e.g., MMC) protocol for data exchanges between the host and the memory interface 2330.

The memory card 2000 may be applicable to Multimedia Cards (MMCs), Security Digitals (SDs), miniSDs, memory sticks, smartmedia, transflash cards, etc.

The memory card 2000 may perform the partial programs with respect to the selected and adjacent word lines as described with reference to FIGS. 1 through 12, the coupling effect between the adjacent memory cells may be reduced. Thus the memory card 200 may have enhanced reliability of the stored and read data.

Figure 14:
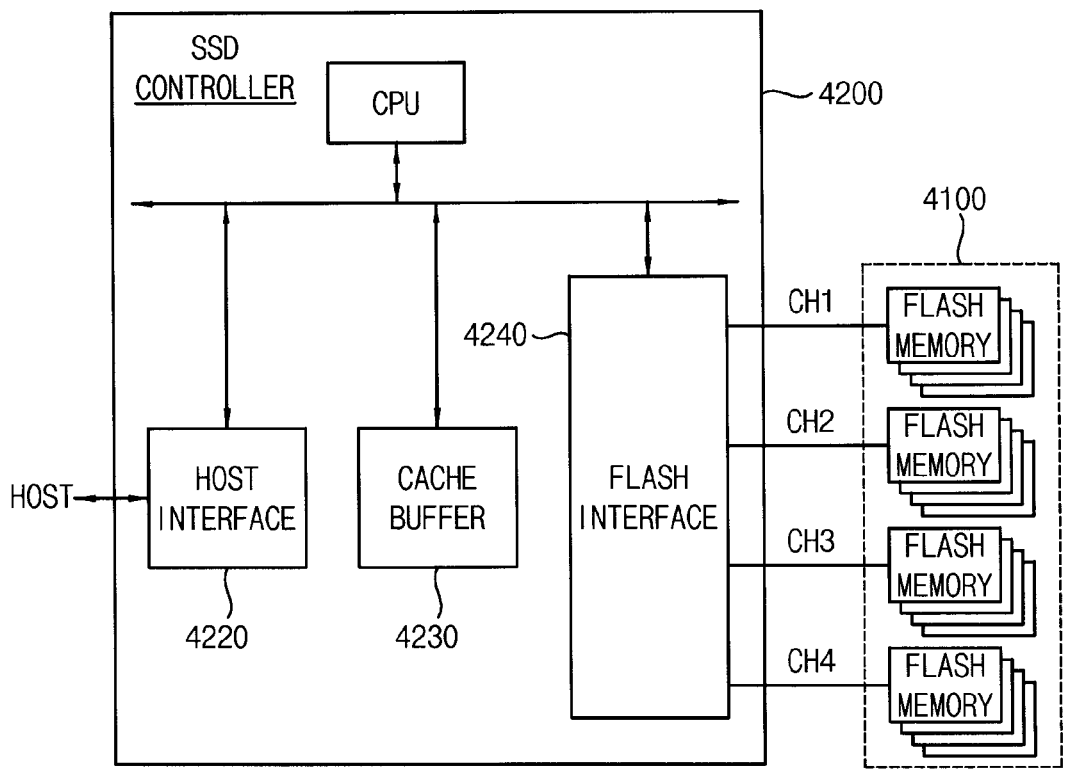
FIG. 14 is a block diagram illustrating a solid state device (SSD) according to example embodiments of the inventive concepts.

FIG. 14 is a block diagram illustrating a solid state device (SSD) according to at least some example embodiments of the inventive concepts.

Referring to FIG. 14, an SSD 4000 may include a plurality of flash memory devices 4100 and an SSD controller 4200. Each of the flash memory devices 4100 may be implemented in the same or substantially the same manner as the flash memory device 100 discussed above with reference to FIGS. 2A-12.

The SSD controller 4200 may control the plurality of flash memory devices 4100. The SSD controller 4200 may include at least one CPU 4210, a host interface 4220, a buffer 4230, and a flash interface 4240.

Under the control of the CPU 4210, the host interface 4220 may exchange data with a host through the ATA protocol. The host interface 4220 may be one of a Serial Advanced Technology Attachment (SATA) interface, a Parallel Advanced Technology Attachment (PATA) interface, and an External SATA (ESATA) interface. Data to be received or transmitted from or to the host through the host interface 4220 may be delivered through the buffer 4230 without passing through a CPU bus, under the control of the CPU 4210.

The buffer 4230 may temporarily store data transferred between an external device and the flash memory devices 4100. The buffer 4230 may be used to store programs to be executed by the CPU 4210. The buffer 4230 may be implemented using a SRAM. The buffer 4230 in FIG. 21 may be included within the SSD controller 4200. However, the inventive concepts are not limited thereto. The buffer 4230 according to an example embodiment of inventive concepts may be provided at an outside of the SSD controller 4200.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories.

The SSD 4000 according to an example embodiment of inventive concepts may perform the partial programs with respect to the selected and adjacent word lines as described with reference to FIGS. 1 through 12, the coupling effect between the adjacent memory cells may be reduced. Thus the SSD 4000 may have enhanced reliability of the stored and read data.

Figure 15:
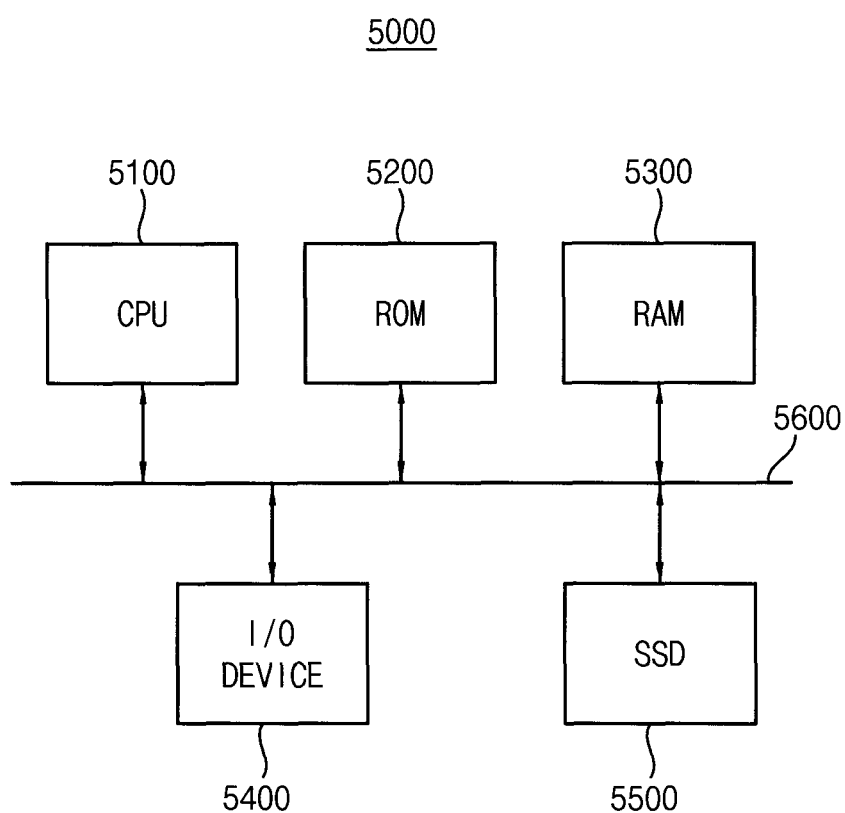
FIG. 15 is a block diagram illustrating a computing system according to example embodiments of the inventive concepts.

FIG. 15 is a block diagram illustrating a computing system according to at least some example embodiments of the inventive concepts.

Referring to FIG. 15, a computing system 5000 may include at least one CPU 5100, a ROM 5200, a RAM 5300, an input/output (I/O) device 5400, and at least one SSD 5500.

The at least one CPU 5100 may be connected to a system bus. The ROM 5200 may store data used to drive the computing system 5000. Herein, the data may include a start command sequence or a basic I/O system (BIOS) sequence. The RAM 5300 may temporarily store data generated during the execution of the CPU 5100.

The I/O device 5400 may be connected to the system bus through an I/O device interface such as keyboards, pointing devices (e.g., mouse), monitors, modems, and the like.

The SSD 5500 may be a readable storage device and may be implemented in the same or substantially the same manner as the SSD 4000 of FIG. 14.

Figure 16:
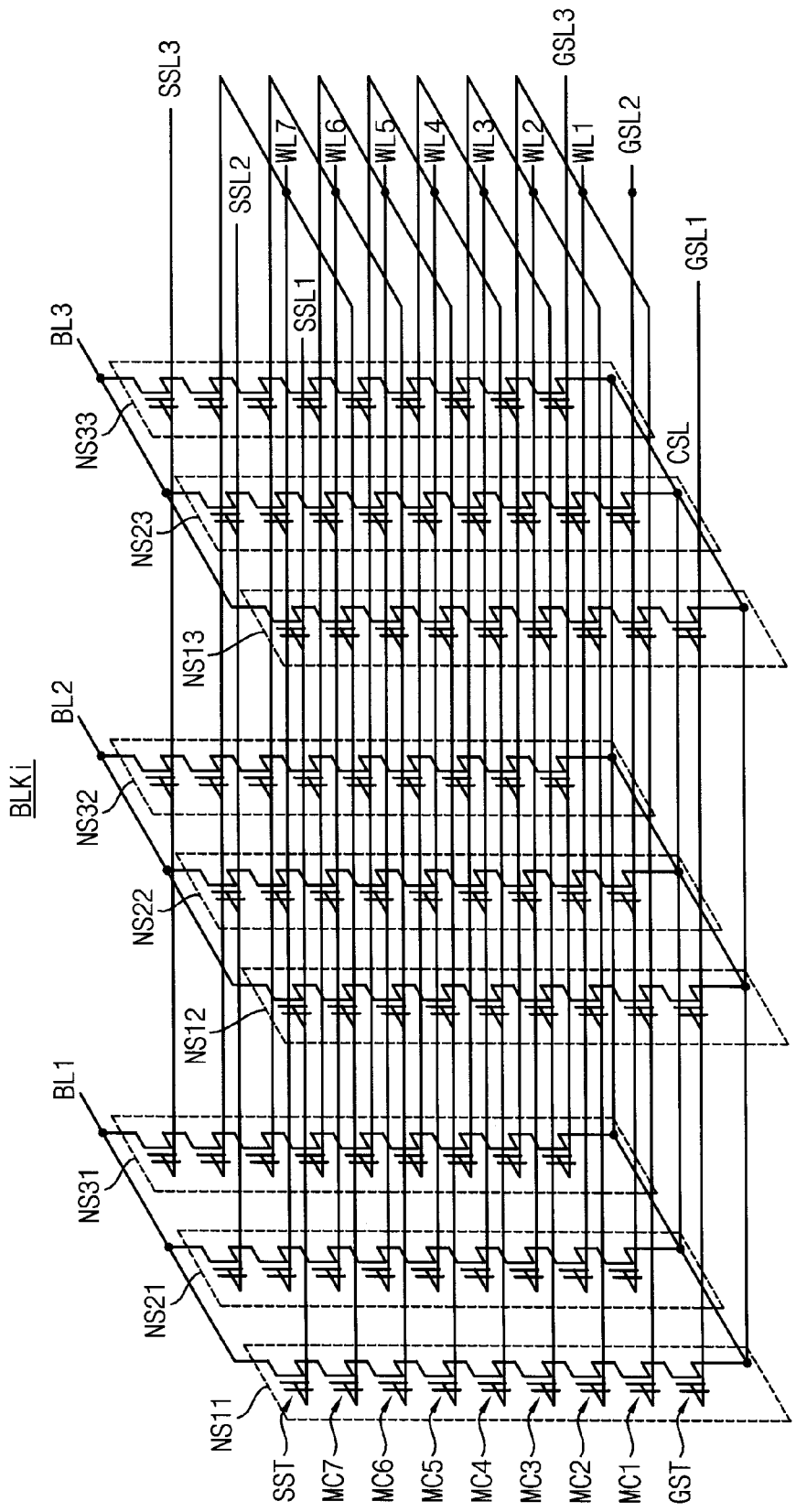
FIG. 16 is a circuit diagram illustrating a three-dimensional flash cell array.

FIG. 16 is a circuit diagram illustrating a three-dimensional flash cell array. According to at least one example embodiment, the memory cell array 110 discussed above with reference to FIGS. 1-15 may have the structure illustrated in FIG. 16. FIG. 16 illustrates one memory block BLKi including a plurality of vertical strings NS.

Referring to FIG. 16, vertical strings NS11, NS21, and NS31 may be provided between a first bit line BL1 and a common source line CSL, vertical strings NS12, NS22, and NS32 may be provided between a second bit line BL2 and the common source line CSL, and vertical strings NS13, NS23, and NS33 may be provided between a third bit line BL3 and the common source line CSL. The first through third bit lines BL1 through BL3 may correspond to conductive materials, respectively, extending in the direction perpendicular to the vertical strings and the common source lines.

A string selection transistor SST of each vertical string NS may be connected to a corresponding bit line BL. A ground selection transistor GST of each vertical string NS may be connected to the common source line CSL. In each vertical string NS, memory cells MC may be provided between the string selection transistor SST and the ground selection transistor GST.

The vertical strings NS may be defined by the row and by the column. The vertical strings NS connected to one bit line in common may form one column. For example, the vertical strings NS11 through NS31 connected to the first bit line BL1 may correspond to a first column. The vertical strings NS12 through NS32 connected to the second bit line BL2 may correspond to a second column. The vertical strings NS13 through NS33 connected to the third bit line BL3 may correspond to a third column.

The vertical strings NS connected to one string selection line SSL may form one row. For example, the vertical strings NS11 through NS13 connected to a first string selection line SSL1 may form a first row. The vertical strings NS21 through NS23 connected to a second string selection line SSL2 may form a second row. The vertical strings NS31 through NS33 connected to a third string selection line SSL3 may form a third row.

In each vertical string NS, a height may be defined. In at least some example embodiments of the inventive concepts, in each vertical string NS, a memory cell MC1 adjacent to the ground selection transistor GST may be defined to have a height of 1. In each vertical string NS, a height of a memory cell may increase in inverse proportion to a distance from a string selection transistor SST. In each vertical string NS, a memory cell MC7 adjacent to the string selection transistor SST may be defined to have a height of 7.

The vertical strings in the same row may share the string selection line SSL. The vertical strings in different rows may be connected to different string selection lines SSL1, SSL2, and SSL3, respectively. In each vertical string NS in the same row, memory cells having the same height may share a word line WL. At the same height, word lines WL connected to memory cells of vertical strings in different rows may be connected in common.

In at least some example embodiments of the inventive concepts, the word lines WL may be connected in common at a layer where conductive materials extending along a first direction are provided. In at least some example embodiments of the inventive concepts, the conductive materials extending along the first direction may be connected to an upper layer via contacts. The conductive materials extending along the first direction may be connected in common at the upper layer.

In the same row of vertical strings NS, ground selection transistors GST may share a ground selection line GSL. In different rows of vertical strings NS, ground selection transistors GST may share the ground selection line GSL. That is, the vertical strings NS11 through NS13, NS21 through NS23, and NS31 through NS33 may be connected in common to the ground selection line GSL. The common source line CSL may be connected in common to vertical strings NS.

As illustrated in FIG. 16, word lines WL placed at the same height may be connected in common. Thus, when a word line placed at a specific height is selected, all vertical strings connected with the selected word line may be selected. The vertical strings NS in different rows may be connected to different string selection lines SSL. Thus, vertical strings NS in an unselected row from among vertical strings connected with the same word line may be separated from a corresponding bit line by selecting the string selection lines SSL1 through SSL3. That is, a row of vertical strings may be selected by selecting and unselecting the string selection lines SSL1 through SSL3. A column of vertical strings in a selected row may be selected by selecting bit lines BL1 through BL3.

The memory system or the memory device according to at least some example embodiments of the inventive concepts may be mounted using various packages. For example, memory system or the memory device may be mounted using PoP(Package on Package), Ball grid arrays(BGAs), Chip scale packages(CSPs), Plastic Leaded Chip Carrier(PLCC), Plastic Dual In-Line Package(PDIP), Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP), etc.

The method of writing data according to at least some example embodiments of the inventive concepts may be applied to various non-volatile memory devices such as, flash memory, RRAM, PRAM, MRAM, FRAM, etc, which include a plurality of adjacent word lines and may be applied various systems including such memory devices.

The foregoing is illustrative of example embodiments and is not to be construed as limiting thereof. Although a few example embodiments have been described, those skilled in the art will readily appreciate that many modifications are possible in example embodiments of the inventive concepts without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments of the inventive concepts and is not to be construed as limited to the specific example embodiments disclosed, and that modifications to the disclosed example embodiments, as well as other example embodiments, are intended to be included within the scope of the appended claims.

What is claimed is:

1. A method of writing data in a non-volatile memory device, the method comprising:
   receiving a program command and a first row address corresponding to a first word line;
   performing a first partial programming operation with respect to first memory cells coupled to the first word line;
   performing a second partial programming operation with respect to second memory cells coupled to a second word line adjacent to the first word line;
   performing a first verification operation by verifying the first partial programming operation after performing the second partial programming operation; and
   selectively performing a first additional programming operation with respect to the first memory cells depending on a result of the first verification operation.

2. The method of claim 1, wherein the first partial programming operation is performed by applying a first program voltage to the first word line, the second partial programming operation is performed by applying a second program voltage to the second word line, and the first additional programming operation is performed by applying pulse voltages to the first word line, the pulse voltages increasing sequentially from a third program voltage greater than the first program voltage.

3. The method of claim 2, further comprising:
   performing a first additional programming verification operation by verifying the first additional programming operation,
   wherein the first additional programming operation is performed by alternatively applying a verification voltage and each of the pulse voltages to the first word line based on results of the first additional programming verification operation.

4. The method of claim 1, further comprising:
   receiving the program command and a second row address corresponding to a second word line after the first additional programming operation is completed;
   performing a third partial programming operation with respect to third memory cells coupled to a third word line adjacent to the second word line;
   performing a second verification operation by verifying the second partial programming operation; and
   performing a second additional programming operation with respect to the second memory cells based on a result of the second verification operation.

5. The method of claim 1, wherein first program data is received and stored in a data latch of the non-volatile memory device, and the first partial programming operation is performed based on the first program data in the data latch, and
   wherein after the first partial programming operation is completed, second program data is received and stored in the data latch, and the second partial programming operation is performed based on the second program data in the data latch.

6. The method of claim 5, wherein after the second partial programming operation is completed, the first program data is received and stored again in the data latch, and the first additional programming operation is performed based on the first program data in the data latch.

7. The method of claim 6, further comprising:
performing a first additional programming verification operation by verifying the first additional programming operation,
wherein the first additional programming operation is performed by applying the pulse voltages to the first word line based on the first program data in the data latch without receiving additional data for the first additional programming operation, and the pulse voltages are applied sequentially to the first word line until results of the first additional programming verification operation indicate that the first additional programming operation is completed.

8. The method of claim 1, wherein first program data is received and stored in a first data latch, second program data is received and stored in a second latch, the first partial programming operation is performed based on the stored first program data, the second partial programming operation is performed based on the stored second program data, and the first additional programming operation is performed based on the stored first program data.

9. The method of claim 8, wherein the stored first program data is used to perform both of the first partial programming operation and the first additional programming operation, and the stored second program data is used to perform only the second partial programming operation.

10. The method of claim 9, further comprising:
receiving the program command and a second row address corresponding to a second word line after the first additional programming operation is completed;
performing a third partial programming operation with respect to third memory cells coupled to a third word line adjacent to the second word line;
performing a second verification operation by verifying the second partial programming operation; and
performing a second additional programming operation with respect to the second memory cells depending on a result of the second verification operation.

11. The method of claim 1, wherein the first and second memory cells are included in a plurality of memory cells of the non-volatile memory device, the plurality of memory cells are multi-level cells, each multi-level cell of the plurality of memory cells stores at least two data bits, and the first additional programming operation includes programming data having at least two data bits into the first memory cells.

12. The method of claim 11, wherein each of the plurality of memory cells stores N data bits, each of the plurality of memory cells is programmed to have one of $2^N$ data states, the first and second partial programming operations are performed by applying a first program voltage pulse set of $2^N-1$ pulse voltages to the first word line and the second word line, respectively, and the first additional programming operation is performed by applying a second program voltage pulse set of $2^N-1$ pulse voltages to the first word line, the $2^N-1$ pulse voltages of the second program voltage pulse set increasing sequentially from voltage levels greater than the $2^N-1$ pulse voltages of the first program voltage pulse set.

13. The method of claim 12, wherein the first additional programming is verified by applying a set of verification voltage pulses to the first word line, the set of verification voltage pulses including $2^N-1$ verification voltages respectively corresponding to the $2^N$ data states.

14. The method of claim 13, further comprising:
performing a first additional programming verification operation by verifying the first additional programming operation,
wherein the first additional programming operation is performed by alternatively applying the second program voltage pulse set and the set of verification voltage pulses to the first word line based on results of the first additional programming verification operation.

15. The method of claim 1, wherein the first verification operation is performed using a plurality of sense amplifiers included in the non-volatile memory device, each of the plurality of sense amplifiers being coupled to a bit line of the non-volatile memory device.

16. The method of claim 1, wherein the first memory cells are implemented as a first vertical string of cells, the second memory cells are implemented as a second vertical string of cells, the first partial programming operation is performed on the first vertical string of cells, and the second partial programming operation is performed on the second vertical string of cells, the first and second vertical strings being formed in a vertical direction to a semiconductor substrate.

17. A method of writing data in a non-volatile memory device, the method comprising:
receiving a program command indicating first data to be programmed into first memory cells of a first word line; and
programming the first data into the first memory cells by,
determining whether threshold voltages of the first memory cells correspond to the first data after performing a first partial programming operation on the first memory cells and after performing a second partial programming operation on second memory cells coupled to a second word line adjacent to the first word line, and
selectively performing an additional programming operation on the first memory cells depending on a result of the determining.

18. The method of claim 17, further comprising:
performing the first partial programming operation; and
performing the second partial programming operation,
wherein the first partial programming operation is performed before the second partial programming operation, and selectively performing the additional programming operation includes programming the first data into the first memory cells if the determining indicates that threshold voltages of the first memory cells do not correspond to the first data indicated in the received program command.

19. The method of claim 18, wherein the programming the first data includes performing an incremental step pulse programming (ISPP) operation on the first memory cells, and the first partial programming operation includes applying a first one of a plurality of program pulses of the ISPP operation to the first memory cells, respective voltages of the plurality of program pulses increasing incrementally from the first one of the plurality of program pulses to a last one of the plurality of program pulses.

20. The method of claim 19, wherein the additional programming operation includes applying, to the first memory cells, one or more of the plurality of program pulses other than the first program pulse until the first data is programmed into the first memory cells.

* * * * *